US011023083B2

(12) United States Patent
Jo et al.

(10) Patent No.: US 11,023,083 B2
(45) Date of Patent: Jun. 1, 2021

(54) TOUCH PANEL AND DISPLAY APPARATUS INCLUDING THE SAME

(71) Applicant: Samsung Display Co., Ltd., Yongin-si (KR)

(72) Inventors: A-Ra Jo, Seoul (KR); Sang-Hyun Lim, Cheonan-si (KR); Chang-Sub Jung, Hwaseong-si (KR); Jae-Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/688,279

(22) Filed: Nov. 19, 2019

(65) Prior Publication Data
US 2020/0089363 A1 Mar. 19, 2020

Related U.S. Application Data

(63) Continuation of application No. 15/279,378, filed on Sep. 28, 2016, now Pat. No. 10,514,800.

(30) Foreign Application Priority Data

Nov. 13, 2015 (KR) .................. 10-2015-0160020

(51) Int. Cl.
*G06F 3/041* (2006.01)
*G06F 3/044* (2006.01)
(Continued)

(52) U.S. Cl.
CPC ............ *G06F 3/0443* (2019.05); *G06F 3/041* (2013.01); *G06F 3/0412* (2013.01);
(Continued)

(58) Field of Classification Search
None
See application file for complete search history.

(56) References Cited

U.S. PATENT DOCUMENTS 9,639,220 B2 5/2017 Wang
9,846,517 B2 12/2017 Li et al.
(Continued)

FOREIGN PATENT DOCUMENTS

CN 103941946 7/2014
CN 104090680 10/2014
(Continued)

OTHER PUBLICATIONS

Extended European Search Report dated Feb. 8, 2017, in European Patent Application No. 16197471.2.
(Continued)

*Primary Examiner* — Matthew Yeung
(74) *Attorney, Agent, or Firm* — H.C. Park & Associates, PLC

(57) ABSTRACT

A touch panel includes first touch electrodes, second touch electrodes, and third touch electrodes. The first touch electrodes include sub electrodes spaced apart from one another in a first direction. The second touch electrodes extend in a second direction crossing the first direction. The second touch electrodes are spaced apart from one another in the first direction. The third touch electrodes extend in the second direction and are spaced apart from one another in the first direction. The third touch electrodes are shaped differently than the second touch electrodes.

31 Claims, 19 Drawing Sheets

(51) Int. Cl.
*H01L 27/32* (2006.01)
*H01L 51/52* (2006.01)

(52) U.S. Cl.
CPC .......... *G06F 3/0416* (2013.01); *G06F 3/0446* (2019.05); *G06F 3/0448* (2019.05); *H01L 27/323* (2013.01); *H01L 51/529* (2013.01); *H01L 51/5253* (2013.01); *G06F 2203/04103* (2013.01); *G06F 2203/04106* (2013.01)

(56) References Cited

U.S. PATENT DOCUMENTS

| | | |
|---|---|---|
| 2005/0110396 A1* | 5/2005 | Cok ................... H01L 51/5243 313/503 |
| 2009/0315854 A1 | 12/2009 | Matsuo |
| 2011/0007020 A1 | 1/2011 | Hong et al. |
| 2011/0242050 A1 | 10/2011 | Byun et al. |
| 2013/0257786 A1 | 10/2013 | Brown et al. |
| 2014/0071083 A1 | 3/2014 | Yoo et al. |
| 2014/0152919 A1 | 6/2014 | Philipp |
| 2014/0192009 A1 | 7/2014 | Lai et al. |
| 2014/0198078 A1 | 7/2014 | Wu et al. |
| 2015/0060256 A1 | 3/2015 | Kim et al. |
| 2015/0109245 A1 | 4/2015 | Chou et al. |
| 2015/0179122 A1* | 6/2015 | Brown ................. G09G 3/3696 345/174 |
| 2015/0205405 A1 | 7/2015 | Yumoto et al. |
| 2015/0268783 A1* | 9/2015 | Yoon ..................... G06F 3/0446 345/173 |
| 2015/0313006 A1 | 10/2015 | Lane et al. |
| 2016/0179134 A1 | 6/2016 | Ryu |

FOREIGN PATENT DOCUMENTS

| | | |
|---|---|---|
| EP | 2905683 | 8/2015 |
| KR | 10-2015-0004579 | 1/2015 |
| KR | 10-2015-0077205 | 7/2015 |

OTHER PUBLICATIONS

Examination Report dated Nov. 13, 2018, in European Patent Application No. 16197471.2.
Notice of Allowance dated Aug. 15, 2019, in U.S. Appl. No. 15/279,378.
Non-Final Office Action dated Apr. 16, 2019, in U.S. Appl. No. 15/279,378.
Advisory Action dated Dec. 18, 2018, in U.S. Appl. No. 15/279,378.
Final Office Action dated Sep. 27, 2018, in U.S. Appl. No. 15/279,378.
Non-Final Office Action dated Jan. 11, 2018, in U.S. Appl. No. 15/279,378.
Office Action dated Oct. 19, 2020, in Chinese Patent Application No. 201611041581.9.

* cited by examiner

TOUCH PANEL AND DISPLAY APPARATUS INCLUDING THE SAME

CROSS-REFERENCE TO RELATED APPLICATIONS

This application is a Continuation of U.S. patent application Ser. No. 15/279,378, filed Sep. 28, 2016, which claims priority to and the benefit of Korean Patent Application No. 10-2015-0160020, filed Nov. 13, 2015, each of which is incorporated by reference for all purposes as if fully set forth herein.

BACKGROUND

Field

Exemplary embodiments relate to a touch panel and a display apparatus including the same, and, more particularly, to a touch panel configured to detect touch interactions of a variety of different types of touch input members and a display apparatus including the same.

Discussion of the Background

With an increase in mobile devices has come a concomitant development of touch panels that may be included in (or otherwise used in association with) a display apparatus of a mobile device, such as a notebook computer, personal digital assistant, smartphone, tablet, wearable computing devices, etc. The touch panel may be a resistive type, a light sensing type, a capacitive type, and/or the like. Among the various types of touch panels, capacitive type touch panels, which may detect a change in capacitance associated with a touch (or a near touch) of, for instance, a finger or conductive member, are relatively rugged and reliable.

In general, a conventional touch panel may include a touch screen panel that senses a touch of, for example, a human finger and a digitizer sheet that senses a touch of, for instance, a stylus. Each of the touch screen panel and the digitizer sheet may recognize touch coordinates of an X-axis and a Y-axis. Typically, the digitizer sheet operates independently of the touch screen panel to enable detection of both human finger touch interactions and stylus touch interactions.

The above information disclosed in this Background section is only for enhancement of understanding of the background of the inventive concept, and, therefore, it may contain information that does not form the prior art that is already known to a person of ordinary skill in the art.

SUMMARY

Exemplary embodiments provide an integrated touch panel configured to detect both human finger touch interactions and stylus pen touch interactions.

One or more exemplary embodiments provide a display apparatus including the integrated touch panel configured to detect both human finger touch interactions and stylus pen touch interactions.

Additional aspects will be set forth in the detailed description which follows, and, in part, will be apparent from the disclosure, or may be learned by practice of the inventive concept.

According to one or more exemplary embodiments, a touch panel includes first touch electrodes, second touch electrodes, and third touch electrodes. The first touch electrodes include sub electrodes spaced apart from one another in a first direction. The second touch electrodes extend in a second direction crossing the first direction. The second touch electrodes are spaced apart from one another in the first direction. The third touch electrodes extend in the second direction and are spaced apart from one another in the first direction. The third touch electrodes are shaped differently than the second touch electrodes.

According to one or more exemplary embodiments, a display apparatus includes a display panel and a touch panel. The display panel includes a circuit substrate, an organic light emitting element disposed on the circuit substrate, and an encapsulating glass covering the organic light emitting element. The touch panel is disposed on the display panel. The touch panel includes first touch electrodes, second touch electrodes, and third touch electrodes. The first touch electrodes include sub electrodes spaced apart from one another in a first direction. The second touch electrodes extend in a second direction crossing the first direction. The second touch electrodes are spaced apart from one another in the first direction. The third touch electrodes extend in the second direction and are spaced apart from one another in the first direction. The third touch electrodes are shaped differently than the second touch electrodes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
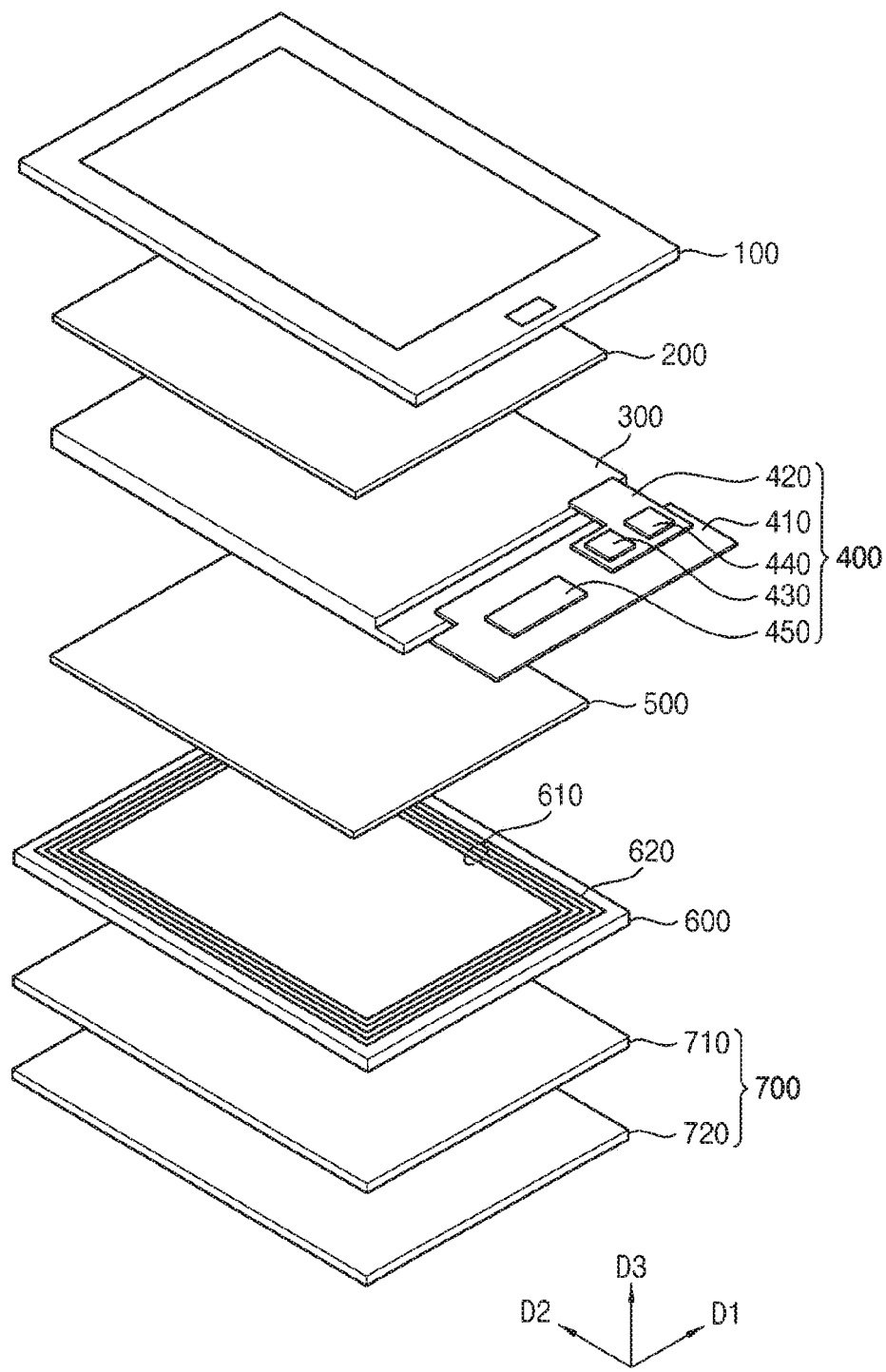
FIG. 1 is an exploded perspective view of a display apparatus, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the D1-axis, the D2-axis, and the D3-axis are not limited to three axes of a rectangular coordinate system, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
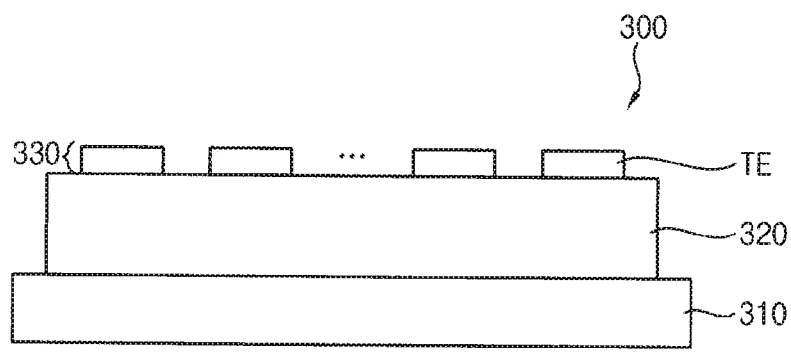
FIG. 2 is a cross-sectional view of a display panel and a touch panel of the display apparatus of FIG. 1, according to one or more exemplary embodiments.
Figure 3:
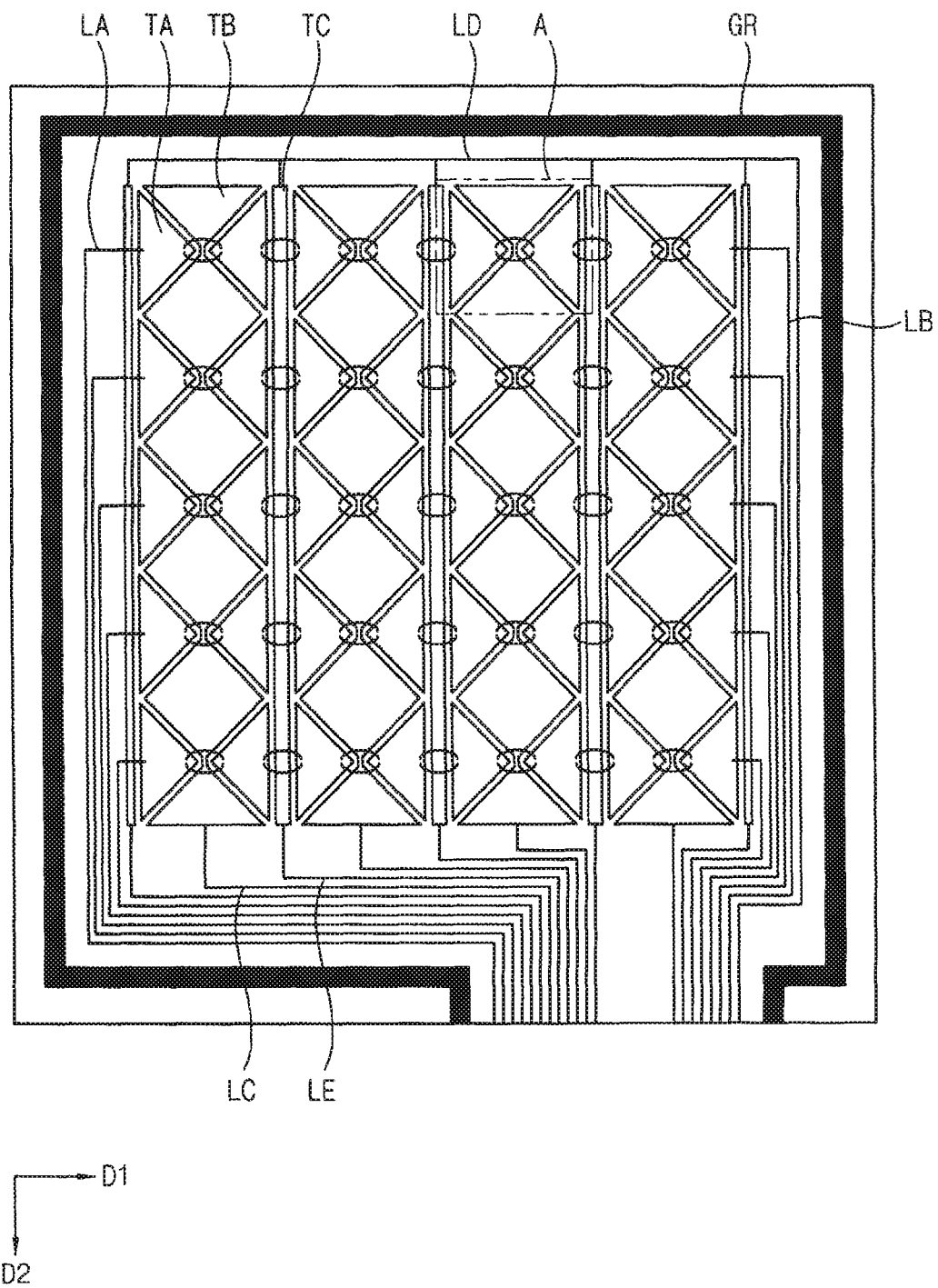
FIG. 3 is a plan view of the touch panel of FIG. 2, according to one or more exemplary embodiments.
Figure 4:
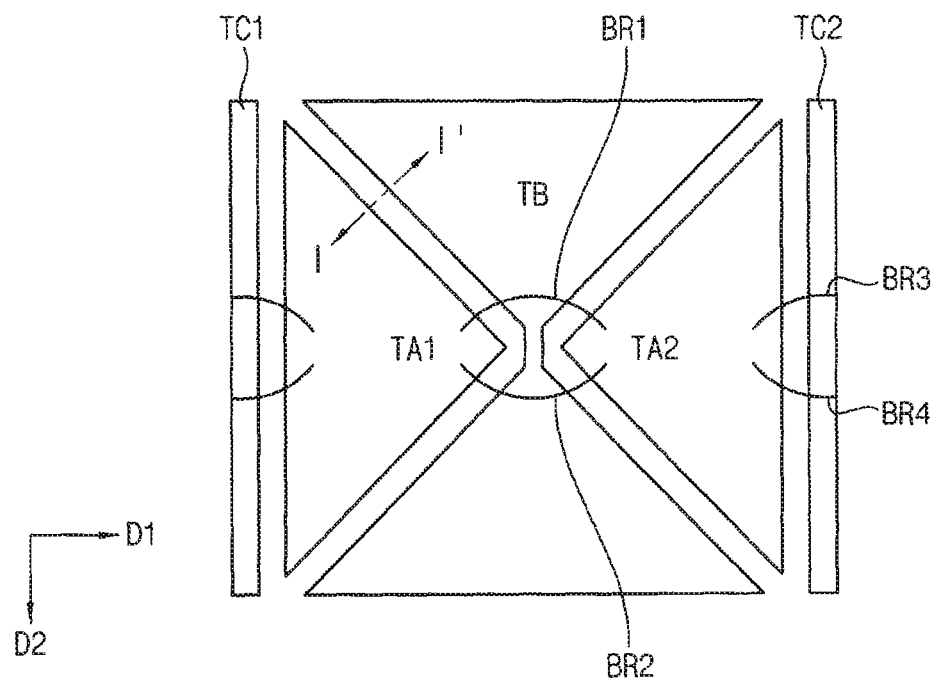
FIG. 4 is a plan view of a touch cell of the touch panel of FIG. 3, according to one or more exemplary embodiments.

FIG. 1 is an exploded perspective view of a display apparatus, according to one or more exemplary embodiments. FIG. 2 is a cross-sectional view of a display panel and a touch panel of the display apparatus of FIG. 1, according to one or more exemplary embodiments. FIG. 3 is a plan view of the touch panel of FIG. 2, whereas FIG. 4 is a plan view of a touch cell of the touch panel of FIG. 3, according to one or more exemplary embodiments.

Referring to FIGS. 1 to 4, the display apparatus includes a touch display panel 300. The touch display panel may include a display panel and a touch panel disposed on the display panel. The display panel displays an image. The touch panel senses a touch event (or interaction), such as an actual touch of the touch panel or a near touch, e.g., a hovering interaction with the touch panel. The display panel and the touch panel may be integrated to form the touch display panel 300.

The display apparatus includes a driver 400 to drive the touch display panel 300. The driver 400 includes a flexible circuit board 410, a connecting circuit part 420, a first touch driving chip 430, a second touch driving chip 440, and a display driving chip 450. The connecting circuit part 420, the first touch driving chip 430, the second touch driving chip 440, and display driving chip 450 may be disposed on the flexible circuit board 410. The connecting circuit part 420 connects the flexible circuit board 410 to the touch display panel 300, and provides an interface between the flexible circuit board 410 and the touch display panel 300. The first touch driving chip 430 senses a first touch on the touch panel by a first touch input member. The second touch driving chip 440 senses a second touch on the touch panel by a second touch input member, which may be a different type of touch input member than the first touch input member. The display driving chip 450 drives the display panel.

According to one or more exemplary embodiments, the display apparatus may further include a polarizing plate 200. The polarizing plate 200 may be disposed on the touch display panel 300. The polarizing plate 200 polarizes light in a direction along a polarizing axis. For example, a cell area of the display panel may be shown as black by the polarizing plate 200. The display apparatus may further include a window 100. The window 100 may be disposed on the polarizing plate 200. As seen in FIG. 1, the window 100 is an upper cover of the display apparatus. The window 100 includes a display area and a light blocking area disposed outside the display area, such as surrounding the display area. The display apparatus may further include a cushion sheet 500. The cushion sheet 500 may be disposed under the touch display panel 300. The cushion sheet 500 protects the touch display panel 300 from an external force.

A magnetic shielding sheet 600 may be disposed under the cushion sheet 500. A power coil 610 providing energy to a touch input member, such as a touch pen (or stylus), may be disposed on the magnetic shielding sheet 600. The touch pen (not shown) may include an LC (or resonant) circuit including an inductor and a capacitor that are connected to each other. The power coil 610 may provide energy to the touch pen by charging the LC circuit of the touch pen according to current flowing through the power coil 610. The power coil 610 may overlap, in a plan view, an outside portion of the touch display panel 300. The power coil 610 may include a plurality of loops. A loop coil 620 may be disposed on the magnetic shielding sheet 600. The loop coil 620 may be adjacent to the power coil 610. The loop coil 620 may be connected to electrodes (not shown) of the touch panel to recognize a touch of the touch pen. The electrodes of the touch panel and the loop coil 620 may provide a digitizing operation, which recognizes a touch coordinate of the touch pen. The loop coil 620 may overlap the outside portion of the touch display panel 300 in a plan view. The loop coil 620 may form a single closed loop overlapping the outside portion of the touch display panel 300 in a plan view. It is contemplated, however, that any other suitable configuration may be utilized in association with exemplary embodiments described herein.

The display apparatus may further include a heat dissipating member (or heat dissipater) 700 dissipating heat from the display apparatus. In one or more exemplary embodiments, the heat dissipating member 700 may include a first heat dissipating sheet 710 and a second heat dissipating sheet 720. For example, the first heat dissipating sheet 710 may include graphite. For example, the second heat dissipating sheet 720 may include copper (Cu). In one or more exemplary embodiments, the heat dissipating member 700 may include only one of the first heat dissipating sheet 710 and the second heat dissipating sheet 720.

The touch display panel 300 includes a base substrate 310, an organic light emitting element (not shown), an encapsulating glass 320 to cover the organic light emitting element, and a touch panel 330 disposed on the encapsulating glass 320. Although exemplary embodiments are described in association with an organic light emitting element as a display device, exemplary embodiments are not limited thereto or thereby. The touch panel 330 may include a plurality of touch electrodes TE. An exemplary structure of a touch electrode of the touch panel 330 is described in more detail with reference to FIGS. 3 and 4.

According to one or more exemplary embodiments, the touch panel 330 includes a plurality of touch cells arranged in a first direction D1 and a second direction D2. Although FIG. 3 illustrates four touch cells arranged in the first direction D1 and five touch cells arranged in the second direction D2, exemplary embodiments are not limited to a specific number of the touch cells or an arrangement of the touch cells.

The touch panel 330 include first touch electrodes TA including a plurality of sub electrodes arranged along the first direction D1, second touch electrodes TB arranged along the second direction D2, and third touch electrodes TC extending along the second direction D2. The third touch electrodes TC have different shapes than the second touch electrodes TB and the first touch electrodes TA. The first touch electrodes TA, the second touch electrodes TB, and the third touch electrodes TC may be disposed on the same plane. For example, the first touch electrodes TA, the second touch electrodes TB, and the third touch electrodes TC may be disposed on the encapsulating glass 320.

The first touch electrodes TA and the second touch electrodes TB recognize a first touch by a first touch input member. For example, the first touch electrodes TA may recognize a touch coordinate of an X-axis of the first touch. The second touch electrodes TB may recognize a touch coordinate of a Y-axis of the first touch. The first touch input member may be a portion of a human body, such as a human finger, hand, etc. The first touch may be defined as a general touch operation. The first touch electrodes TA and the third touch electrodes TC recognize a second touch by a second touch input member. The second touch input member may be an object other than a portion of the human body. For instance, the second touch input member may be a touch pen or stylus. The second touch may be defined as a digitizer operation.

First end portions of the first touch electrodes TA may be connected to first lines LA. Second end portions of the first touch electrodes TA may be connected to second lines LB. First end portions of the second touch electrodes TB may be connected to third lines LC. Second end portions of the second touch electrodes TB may not be connected to any lines. First end portions of the third touch electrodes TC may be commonly connected to a fourth line LD. Second end portions of the third touch electrodes TC may be connected to fifth lines LE.

In a first touch mode, both the first lines LA and the second lines LB are connected to the first touch driving chip 430. Also, in the first touch mode, the third lines LC are connected to the first touch driving chip 430. The first touch driving chip 430 may sense the first touch based on signals of the first touch electrodes TA and the second touch electrodes TB transmitted through the first to third lines LA, LB, and LC.

In a second touch mode, the first lines LA are connected to the second touch driving chip 440 and the second lines LB are connected to the loop coil 620. Also, in the second touch mode, the fourth line LD is connected to the loop coil 620 and the fifth lines LE are connected to the second touch driving chip 440. The second touch driving chip 440 may sense the second touch based on signals of the first touch electrodes TA transmitted through the first lines LA, signals of the third touch electrodes TC transmitted through the fifth lines LE, and a signal of the loop coil 620. A method of recognizing the second touch will be described in more detail with reference to FIG. 7.

In touch cell A of the touch panel 330, the first touch electrode TA includes a first sub electrode TA1 and a second sub electrode TA2 spaced apart from the first sub electrode TA1. The second touch electrode TB is disposed between the first sub electrode TA1 and the second sub electrode TA2.

The touch cell A may further include a first bridge BR1 and a second BR2 electrically connecting the first sub electrode TA1 and the second sub electrode TA2 and overlapping the second touch electrode TB in a plan view. In one or more exemplary embodiments, the first and second bridges BR1 and BR2 may be plural as shown in FIG. 4. In one or more exemplary embodiments, the first and second bridges BR1 and BR2 may be configured as a single bridge. When configured as the first and second bridges BR1 and BR2, a resistance of the first touch electrode TA may be reduced.

The third touch electrode TC may be disposed between first and second sub electrodes TA1 and TA2 of different touch cells. For example, the third touch electrode TC1 may be disposed between the first sub electrode TA1 in the touch cell A and a second sub electrode TA2 of a neighboring touch cell adjacent to a first side of the touch cell A in the first direction D1. The third touch electrode TC2 may be disposed between the second sub electrode TA2 in the touch cell A and the first sub electrode TA1 in another neighboring touch cell adjacent to a second side of the touch cell A in the first direction D1.

The touch panel 330 may further include third and fourth bridges BR3 and BR4 electrically connecting the second sub electrode TA2 in the touch cell A and the first sub electrode TA1 in the another neighboring touch cell and overlapping the third touch electrode TC2 in a plan view. In one or more exemplary embodiments, the third and fourth bridges BR3 and BR4 may be plural as shown in FIG. 4. In one or more exemplary embodiments, the third and fourth bridges may be configured as a single bridge. When configured as the third and fourth bridges BR3 and BR4, a resistance of the first touch electrode TA may be reduced.

In one or more exemplary embodiments, the first sub electrode TA1 and the second sub electrode TA2 of the first touch electrode TA, the second touch electrode TB, and the third touch electrode TC may include substantially the same material as one another. For example, the first touch electrode TA, the second touch electrode TB, and the third touch electrode TC may include indium tin oxide (ITO), however, it is contemplated that any other suitable material may be utilized in association with exemplary embodiments described herein. For instance, the first touch electrode TA, the second touch electrode TB, and the third touch electrode TC may be formed of other transparent (or at least translucent) conductive materials, such as aluminum zinc oxide (AZO), gallium zinc oxide (GZO), indium zinc oxide (IZO), etc. It is also contemplated that one or more conductive polymers (ICPs) may be utilized, such as, for example, polyaniline (PANI), poly(3,4-ethylenedioxythiophene) poly (styrenesulfonate) (PEDOT:PSS), etc. In one or more exemplary embodiments, the first and second bridges BR1 and BR2 and the third and fourth bridges BR3 and BR4 may include a material different from the material of the first sub electrode TA1 and the second sub electrode TA2 of the first touch electrode TA.

According to one or more exemplary embodiments, the first to third touch electrodes TA, TB, and TC are included in the touch panel 330 where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. Given that the first to third touch electrodes TA, TB, and TC are included in a single touch panel 330, a width of the display apparatus that is capable of recognizing the first touch and the second touch may be reduced.

Figure 5:
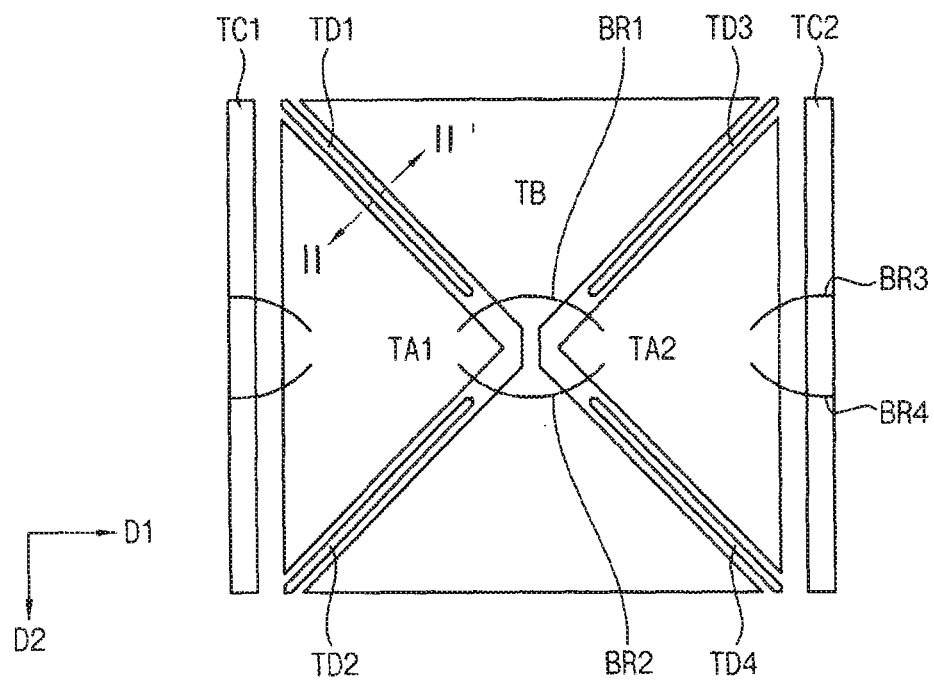
FIG. 5 is a plan view of a touch cell of a touch panel, according to one or more exemplary embodiments.

FIG. 5 is a plan view of a touch cell of a touch panel, according to one or more exemplary embodiments. It is noted that the touch panel and the display apparatus associated with the touch cell of FIG. 5 are substantially similar to the touch panel 300 and the display apparatus FIGS. 1 to 4 except for the structure of the touch cell of FIG. 5. As such, the same reference numerals will be used to refer to the same or like parts as those described in association with FIGS. 1 to 4, and repetitive explanations have been avoided to prevent obscuring exemplary embodiments described herein.

Referring to FIG. 5, a first side of the first sub electrode TA1 faces a first side of the second touch electrode TB. A second side of the first sub electrode TA1 faces a second side of the second touch electrode TB. A first side of the second sub electrode TA2 faces a third side of the second touch electrode TB. A second side of the second sub electrode TA2 faces a fourth side of the second touch electrode TB.

Dissimilar to the touch cell of FIG. 4, the touch cell of FIG. 5 further includes first to fourth dummy electrodes TD1 to TD4. The first dummy electrode TD1 is disposed between the first side of the first sub electrode TA1 and the first side of the second touch electrode TB, the second dummy electrode TD2 is disposed between the second side of the first sub electrode TA1 and the second side of the second touch electrode TB, the third dummy electrode TD3 is disposed between the first side of the second sub electrode TA2 and the third side of the second touch electrode TB, and the fourth dummy electrode TD4 is disposed between the second side of the second sub electrode TA2 and the fourth side of the second touch electrode TB. The first to fourth dummy electrodes TD1 to TD4 may not be connected any other electrodes or any other lines, and, as such, may be electrically floated. The first to fourth dummy electrodes TD1 to TD4 may have island shapes; however, it is contemplated that any other suitable configuration may be utilized in association with exemplary embodiments described herein. For instance, as seen in FIG. 5, the island shapes are island bar shapes. In one or more exemplary embodiments, the first to fourth dummy electrodes TD1 to TD4 may not be disposed in (e.g., spaced apart from) an area where the first and second bridges BR1 and BR2 are formed. That is, the first and second bridges BR1 and BR2 may not overlap the first to fourth dummy electrodes TD1 to TD4.

It is noted that the first touch electrode TA and the second touch electrode TB may function as a transmitter and a receiver, respectively, to recognize the first touch operation. When determining a gap between the first touch electrode TA and the second touch electrode TB, a distance between the touch panel 330 and the window 100 may be considered. When the gap between the first touch electrode TA and the second touch electrode TB is relatively very short as compared to the distance between the touch panel 330 and the window 100, capacitance between the first touch electrode TA and the second touch electrode TB may be relatively strong such that the sensitivity of touch detection may be reduced. When the gap between the first touch electrode TA and the second touch electrode TB increases to address the aforementioned decrease in sensitivity, capacitance between the first touch electrode TA and the second touch electrode TB may not be large enough such that the touch function may not operate normally.

According to one or more exemplary embodiments, the first to fourth dummy electrodes TD1 to TD4 may be provided between each of the sub electrodes TA1 and TA2 of the first touch electrode TA and the second touch electrode TB, and, for example, the gap between each of the sub electrodes TA and TA2 and the second touch electrode TB may increase. In this manner, the capacitance between the first touch electrode TA and the second touch electrode TB may increase such that a sensitivity of touch detection may also increase.

Figure 6A:
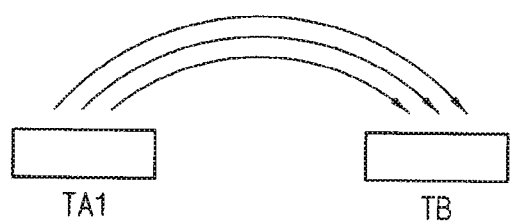
FIG. 6A is a cross-sectional view of the touch cell of FIG. 4 taken along sectional line I-I', according to one or more exemplary embodiments.
Figure 6B:
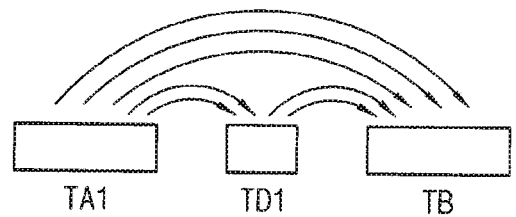
FIG. 6B is a cross-sectional view of the touch cell of FIG. 5 taken along sectional line II-II', according to one or more exemplary embodiments.

FIG. 6A is a cross-sectional view of the touch cell of FIG. 4 taken along sectional line I-I', according to one or more exemplary embodiments. FIG. 6B is a cross-sectional view of the touch cell of FIG. 5 taken along sectional line II-II', according to one or more exemplary embodiments.

Referring to FIG. 6A, a direct magnetic field from the first sub electrode TA1 to the second touch electrode TB is generated. In contrast, referring to FIG. 6B, both a direct magnetic field from the first sub electrode TA1 to the second touch electrode TB and an indirect magnetic field from the first sub electrode TA1 to the second touch electrode TB via the first dummy electrode TD1 are generated. The magnetic field between the first sub electrode TA1 and the second touch electrode TB of FIG. 6B may be greater than that of FIG. 6A when the gap between the first sub electrode TA1 and the second touch electrode TB of FIG. 6B is the same as in FIG. 6A. As such, when the first to fourth dummy electrodes TD1 to TD4 are disposed between the first and second sub electrodes TA1 and TA2 and the second touch electrode TB, the sensitivity of touch detection may be improved.

Adverting back to FIG. 5, it is noted that, in one or more exemplary embodiments, the first to fourth dummy electrodes TD1 to TD4 may be disposed on the same plane as the first and second sub electrodes TA1 and TA2 of the first touch electrode TA, the second touch electrode TB, and the third touch electrode TC. In one or more exemplary embodiments, the first to fourth dummy electrodes TD1 to TD4 may include a material substantially the same as the material of the first and second sub electrodes TA1 and TA2 of the first touch electrode TA, the second touch electrode TB, and the third touch electrode TC. According to one or more exemplary embodiments, the first to third touch electrodes TA, TB, and TC may be included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, a width of the display apparatus configured to recognize the first touch and the second touch may be reduced. In addition, the first to fourth dummy electrodes TD1 to TD4 may be disposed between the first touch electrode TA and the second touch electrode TB so that the sensitivity of touch detection may be improved in association with the first touch operation.

Figure 7:
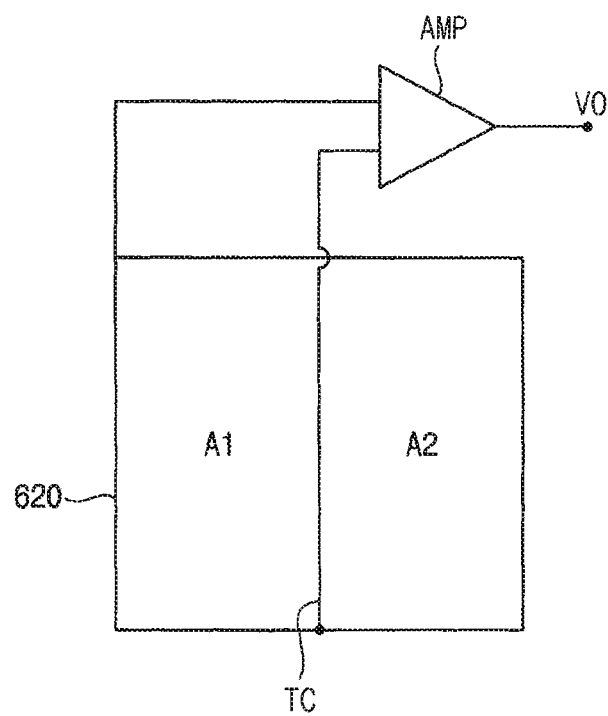
FIG. 7 is a schematic circuit diagram of a digitizing operation of the touch panel of FIG. 3, according to one or more exemplary embodiments.

FIG. 7 is a schematic circuit diagram of a digitizing operation of the touch panel of FIG. 3, according to one or more exemplary embodiments.

Referring to FIGS. 1 to 4 and 7, in the second touch operation of the touch panel 330, first end portions of the third touch electrode TC may be connected to the loop coil 620 through the fourth line LD, and the second end portions of the third touch electrode TC may be connected to an amplifier AMP through one of the fifth lines LE. The amplifier AMP may output a voltage VO to the second touch driving chip 440.

For illustrative convenience, only one of the third touch electrodes TC and a corresponding amplifier AMP are shown in FIG. 7. In FIG. 7, the output voltage VO output through an amplifier AMP when the second touch is generated at a left side A1 of the third touch electrode TC is different from the output voltage VO output through the amplifier AMP when the second touch is generated at a right side A2 of the third touch electrode TC. As such, the second touch driving chip 440 may determine whether the second touch is generated at A1 or A2. Similarly, the touch coordinates of the X-axis and the Y-axis of the second touch may be determined using the first touch electrodes TA, which are disposed in the first direction D1 and have first end portions connected to the loop coil 620 and the third touch electrodes TC, which are disposed in the second direction D2 and have first end portions connected to the loop coil 620.

Figure 8:
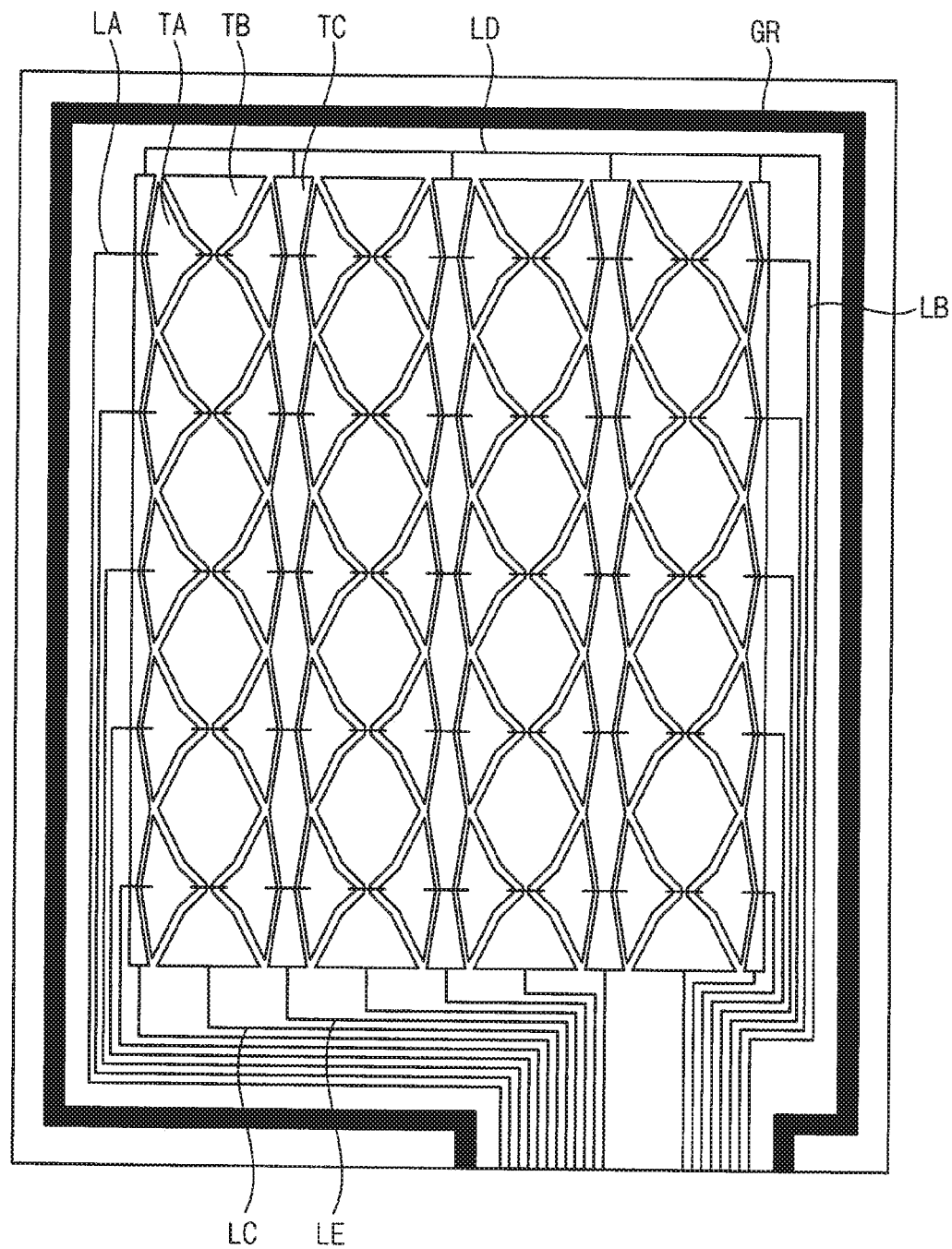
FIG. 8 is a plan view of a touch panel, according to one or more exemplary embodiments.
Figure 9:
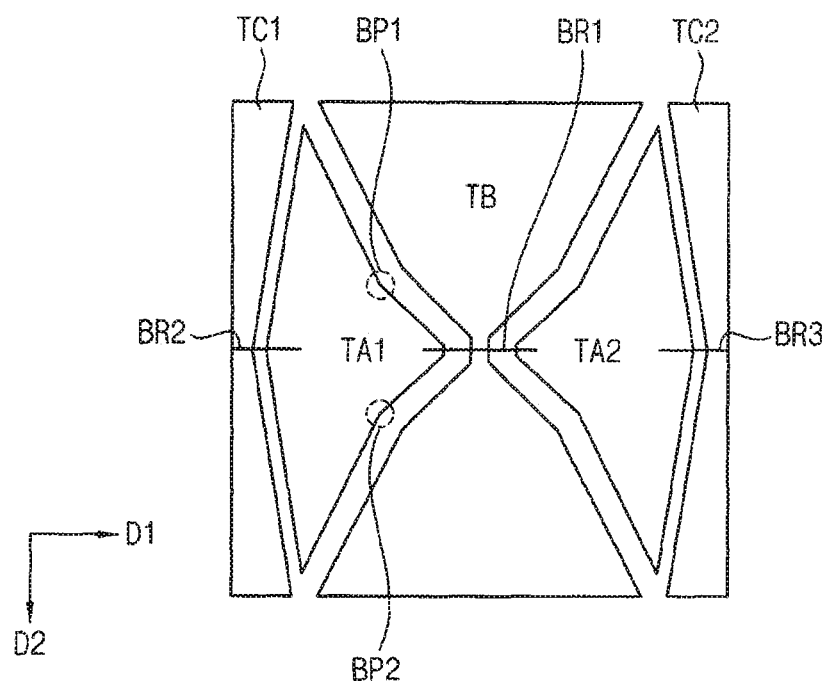
FIG. 9 is a plan view of a touch cell of the touch panel of FIG. 8, according to one or more exemplary embodiments.

FIG. 8 is a plan view of a touch panel, according to one or more exemplary embodiments. FIG. 9 is a plan view of a touch cell of the touch panel of FIG. 8, according to one or more exemplary embodiments.

The touch panel and the display apparatus of FIGS. 8 and 9 are substantially the same as the touch panel and the display apparatus of FIGS. 1 to 4 except for the structure of the touch cells. As such, the same reference numerals will be used to refer to the same or like parts as those described in association with FIGS. 1 to 4, and repetitive explanations have been avoided to prevent obscuring exemplary embodiments described herein.

Referring to FIGS. 8 and 9, the touch cell includes a first touch electrode TA, a second touch electrode TB, and a third touch electrode TC. The first touch electrode TA includes a first sub electrode TA1 and a second sub electrode TA2 spaced apart from the first sub electrode TA1 like as described in association with FIG. 4. The second touch electrode TB is disposed between the first sub electrode TA1 and the second sub electrode TA2. Each of the third touch electrodes TC1 and TC2 is disposed between the sub electrodes TA1 and TA2 included in neighboring touch cells.

The touch cell may further include a first bridge BR1 electrically connecting the first sub electrode TA1 and the second sub electrode TA2 and overlapping the second touch electrode TB in a plan view. The first sub electrode TA1 may include a first inclined portion facing a first side of the second touch electrode TB and a second inclined portion facing a second side of the second touch electrode TB. The first inclined portion may have a first bended portion BP1. The second inclined portion may have a second bended portion BP2. The second sub electrode TA2 may be configured similarly to the first sub electrode TA1, but in a mirrored fashion with respect to the second touch electrode TB.

To maintain uniformity and reliability, a size of the first touch electrode TA may be adjusted to be substantially the same as a size of the second touch electrode TB in the touch cell. To adjust the size of the first touch electrode TA and the size of the second touch electrode TB to be substantially the same as each other, the bended portions BP1 and BP2 may be formed in the first sub electrode TA1 and the second sub electrode TA2.

According to one or more exemplary embodiments, the first to third touch electrodes TA, TB, and TC are integrated in a single touch panel where the first touch electrode TA and the second touch electrode TB operate in conjunction with the first touch operation (the general touch operation) in association with the first touch input member, and the first touch electrode TA and the third touch electrode TC operate in conjunction with the second touch operation (the digitizer operation) in association with the second touch input member. In this manner, a width of the display apparatus configured to detect the first touch and the second touch may be reduced. In addition, a size of the first touch electrode TA and a size of the second touch electrode TB are substantially the same as each other in the touch cell so that reliability of the first touch operation may be improved.

Figure 10:
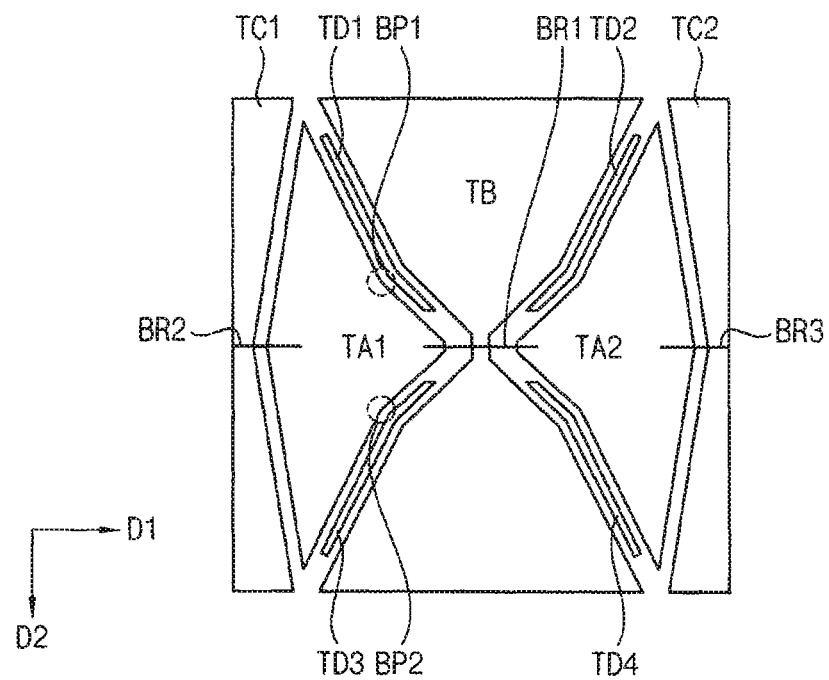
FIG. 10 is a plan view of a touch cell of a touch panel, according to one or more exemplary embodiments.

FIG. 10 is a plan view of a touch cell of a touch panel, according to one or more exemplary embodiments.

The touch panel and the display apparatus of FIG. 10 are substantially the same as the touch panel and the display apparatus of FIGS. 8 and 9 except for the structure of the touch cells. As such, the same reference numerals will be used to refer to the same or like parts as those described in association with FIGS. 8 and 9, and repetitive explanations have been avoided to prevent obscuring exemplary embodiments described herein.

Referring to FIG. 10, the touch cell further includes first to fourth dummy electrodes TD1 to TD4. The first dummy electrode TD1 is disposed between a first inclined portion of the first sub electrode TA1 and a first inclined portion of the second touch electrode TB, the second dummy electrode TD2 is disposed between a first inclined portion of the second sub electrode TA2 and a third inclined portion of the second touch electrode TB, the third dummy electrode TD3 is disposed between a second inclined portion of the first sub electrode TA1 and a second inclined portion of the second touch electrode TB, and the fourth dummy electrode TD4 is disposed between a second inclined portion of the second sub electrode TA2 and a fourth inclined portion of the second touch electrode TB. The first to fourth dummy electrodes TD1 to TD4 may not be connected any electrodes or any lines, and, as such, may be electrically floated. The first to fourth dummy electrodes TD1 to TD4 may have island shapes; however, it is contemplated that any other suitable configuration may be utilized in association with exemplary embodiments described herein. In one or more exemplary embodiments, the first to fourth dummy electrodes TD1 to TD4 may have a bended portion corresponding to a bended portion of an adjacent sub electrode. For instance, the first dummy electrode TD1 may have a bended portion corresponding to the first bended portion BP1 and the second dummy electrode TD2 may have a bended portion corresponding to the second bended portion BP2.

According to one or more exemplary embodiments, the first to fourth dummy electrodes TD1 to TD4 may not be disposed in an area where the first bridge BR1 is disposed. The third touch electrodes TC may have variable widths in the first direction D1, which may vary as a function in the second direction D2. For example, the third touch electrode TC1 may have a relatively greater width in the first direction D1 at upper and lower portions of the touch cell and a relatively shorter width in the first direction D1 at a central portion of the touch cell, such as where a second bridge BR2 is disposed. In this manner, the width of the third touch electrode TC1 may vary from the relatively greater width to the relatively smaller width back to the relatively greater width along a length of the third touch electrode TC1.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of the display apparatus configured to recognize the first touch and the second touch may be reduced. In addition, when the first to fourth dummy electrodes TD1 to TD4 are disposed between the first and second sub electrodes TA1 and TA2 and the second touch electrode TB, the sensitivity of touch detection may be improved for the first touch operation.

Figure 11:
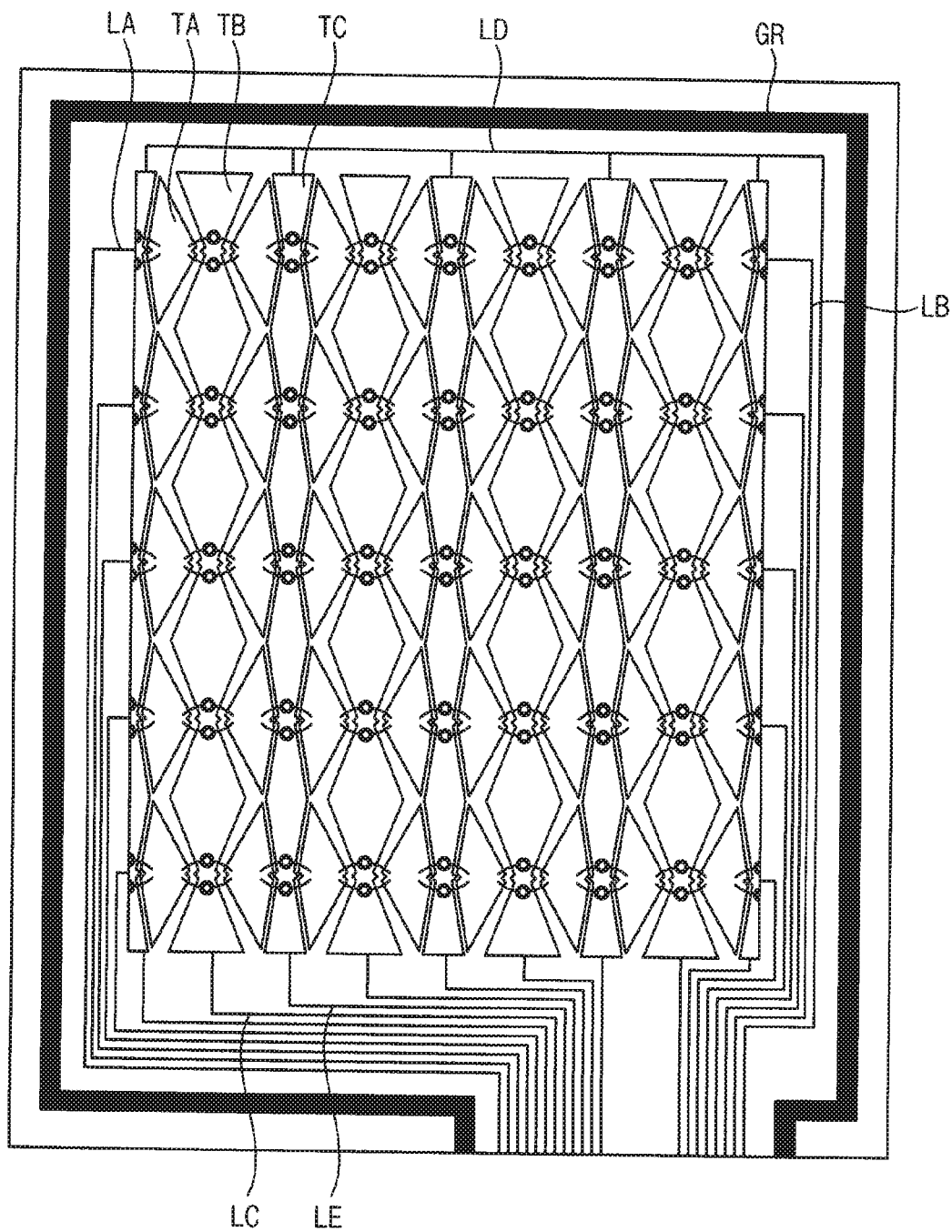
FIG. 11 is a plan view of a touch panel, according to one or more exemplary embodiments.
Figure 12:
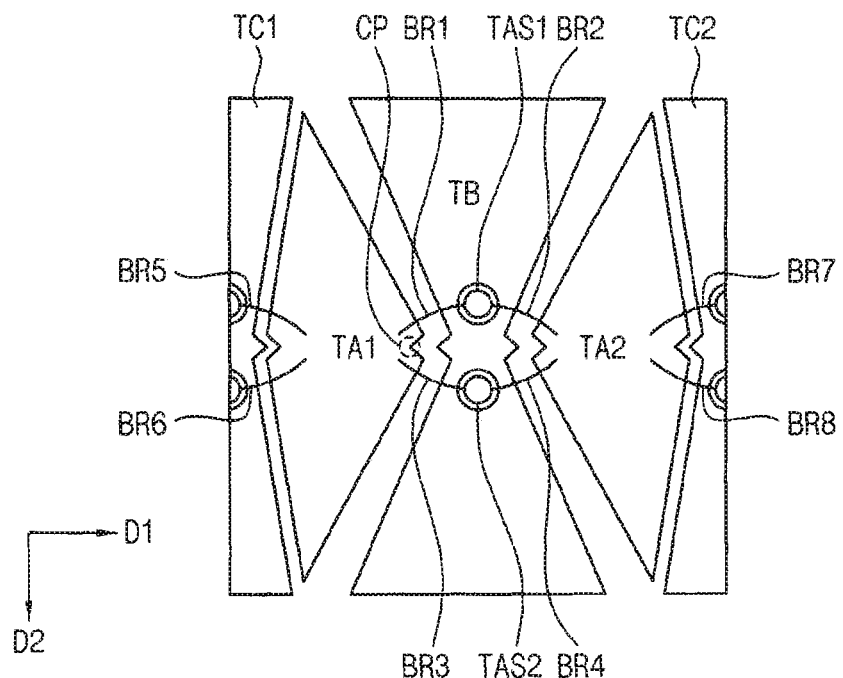
FIG. 12 is a plan view of a touch cell of the touch panel of FIG. 11, according to one or more exemplary embodiments.

FIG. 11 is a plan view of a touch panel, according to one or more exemplary embodiments. FIG. 12 is a plan view of a touch cell of the touch panel of FIG. 11, according to one or more exemplary embodiments.

The touch panel and the display apparatus of FIGS. 11 and 12 are substantially the same as the touch panel and the display apparatus of FIGS. 1 to 4 except for the structure of the touch cells. As such, the same reference numerals will be used to refer to the same or like parts as those described in association with FIGS. 1 to 4, and repetitive explanations have been avoided to prevent obscuring exemplary embodiments described herein.

Referring to FIGS. 11 and 12, the touch cell includes a first touch electrode TA, a second touch electrode TB, and a third touch electrode TC. The first touch electrode TA includes a first sub electrode TA1 and a second sub electrode TA2 spaced apart from the first sub electrode TA1. The second touch electrode TB is disposed between the first sub electrode TA1 and the second sub electrode TA2. Each of the third touch electrodes TC1 and TC2 is disposed between the sub electrodes TA1 and TA2 of neighboring touch cells. The first touch electrode TA may further include first and second connecting electrodes TAS1 and TAS2. It is noted that the first and second connecting electrodes TAS1 and TAS2 may overlap the second touch electrode TB, as seen in FIG. 12.

The touch cell further includes first to fourth bridges BR1 to BR4. The first bridge BR1 electrically connects the first sub electrode TA1 and a first connecting electrode TAS1, and the first bridge BR1 overlaps the second touch electrode TB in a plan view. The second bridge BR2 electrically connects the second sub electrode TA2 and the first connecting electrode TAS1, and the second bridge BR2 overlaps the second touch electrode TB in a plan view. The third bridge BR3 electrically connects the first sub electrode TA1 and a second connecting electrode TAS2, and the third bridge BR3 overlaps the second touch electrode TB in a plan view. The fourth bridge BR4 electrically connects the second sub electrode TA2 and the second connecting electrode TAS2, and the fourth bridge BR4 overlaps the second touch electrode TB in a plan view.

The first sub electrode TA1 and the second sub electrode TA2 are connected to each other by the first to fourth bridges BR1 to BR4 and the first and second connecting electrodes TAS1 and TAS2 so that the resistance may be reduced as compared to when the first sub electrode TA1 and the second sub electrode TA2 are connected to each other with only the bridges, e.g., first and second bridges BR1 and BR2 of FIG. 4. In addition, the presence of the first and second connecting electrodes TAS1 and TAS2 enables the respective lengths of the first to fourth bridges BR1 to BR4 to be relatively shorter. As such, the first to fourth bridges BR1 to BR4 may not be visible to a user.

In one or more exemplary embodiments, the touch cell may further include additional connecting electrodes and fifth to eighth bridges BR5 to BR8. The additional connecting electrodes may be surrounded by (or otherwise overlap) the third touch electrode TC, e.g., third touch electrodes TC1 and TC2. The first sub electrode TA1 may be connected to the second sub electrode TA2 of an adjacent touch cell through the fifth and sixth bridges BR5 and BR6 and corresponding connecting electrodes. The second sub electrode TA2 may be connected to the first sub electrode TA1 of another adjacent touch cell through the seventh and eighth bridges BR7 and BR8 and corresponding connecting electrodes.

The first sub electrode TA1 may include a first inclined portion facing a first side of the second touch electrode TB and a second inclined portion facing a second side of the second touch electrode TB. A contact point CP of the first inclined portion and the second inclined portion may have a concave portion. The second sub electrode TA2 may also be configured including a contact point and associated concave portion. The second touch electrode TB may have a convex portion corresponding to the concave portion of the first sub electrode TA1 and the concave portion of the second sub electrode TA2. In this manner, electrode resistance of the second touch electrode TB may be reduced. Further, the length of the bridge connecting the first sub electrode TA1 and the second sub electrode TA2 may be reduced. The first sub electrode TA1 and second sub electrode TA2 may also include additional concave portions respectively facing the third touch electrodes TC1 and TAC2. To this end, the third touch electrodes TC1 and TAC2 may include convex portions corresponding to the concave portions of the first sub electrode TA1 and the second sub electrode TA2.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member and the first touch electrode TA and the third touch electrode TC operate in conjunction with the second touch operation (the digitizer operation) associated with the second touch input member. In this manner, the width of an associated display apparatus configured to recognize the first touch and the second touch may be reduced. In addition, the resistance of the bridge in the touch cell may be reduced and the bridge may be less visible (or invisible) to a user.

Figure 13:
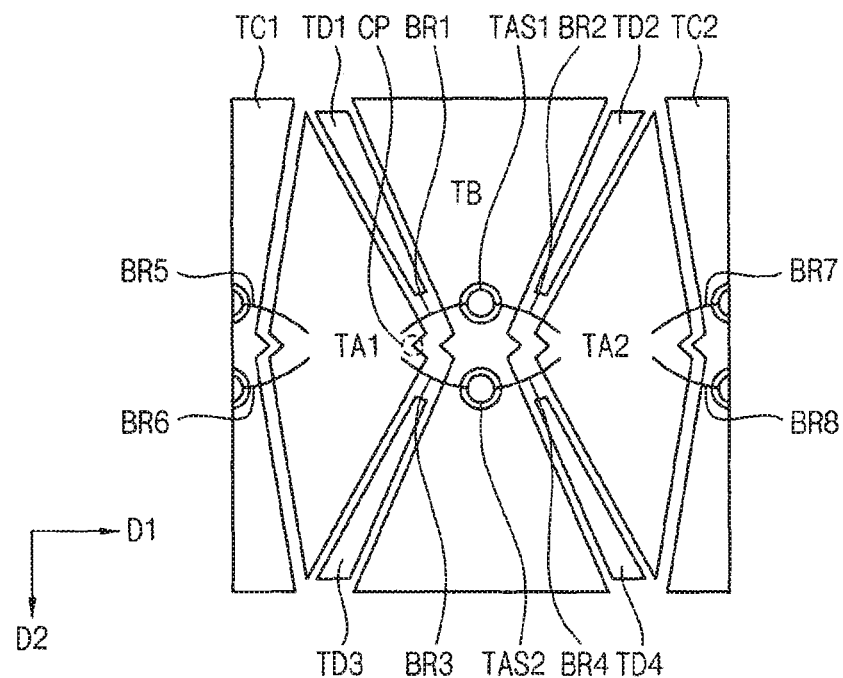
FIG. 13 is a plan view of a touch cell of a touch panel, according to one or more exemplary embodiments.

FIG. 13 is a plan view of a touch cell of a touch panel, according to one or more exemplary embodiments.

The touch panel and the display apparatus of FIG. 13 are substantially the same as the touch panel and the display apparatus of FIGS. 11 and 12 except for the structure of the touch cells. As such, the same reference numerals will be used to refer to the same or like parts as those described in association with FIGS. 11 and 12, and repetitive explanations have been avoided to prevent obscuring exemplary embodiments described herein.

Referring to FIG. 13, the touch cell further includes first to fourth dummy electrodes TD1 to TD4. The first dummy electrode TD1 is disposed between a first inclined portion of the first sub electrode TA1 and a first inclined portion of the second touch electrode TB, the second dummy electrode TD2 is disposed between a first inclined portion of the second sub electrode TA2 and a third inclined portion of the second touch electrode TB, the third dummy electrode TD3 is disposed between a second inclined portion of the first sub electrode TA1 and a second inclined portion of the second touch electrode TB, and the fourth dummy electrode TD4 is disposed between a second inclined portion of the second sub electrode TA2 and a fourth inclined portion of the second touch electrode TB. The first to fourth dummy electrodes TD1 to TD4 may not be connected any electrodes or any lines, and, as such, may be electrically floated. The first to fourth dummy electrodes TD1 to TD4 may have island shapes; however, it is contemplated that any other suitable configuration may be utilized in association with exemplary embodiments described herein. In one or more exemplary embodiments, the first to fourth dummy electrodes TD1 to TD4 may not be disposed in an area where the first to fourth bridges BR1 to BR4 are formed.

According to one or more exemplary embodiments, a third touch electrodes TC may have variable width in the first direction D1, which may vary as a function in the second direction D2. For example, the third touch electrode TC1 may have a relatively greater width in the first direction D1 at upper and lower portions of the touch cell and a relatively shorter width in the first direction D1 at a central portion of the touch cell, such as where the fifth and sixth second bridges BR5 and BR6 are disposed. In this manner, the width of the third touch electrode TC1 may vary from the relatively greater width to the relatively smaller width back to the relatively greater width along a length of the third touch electrode TC1.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of the display apparatus configured to recognize the first touch and the second touch may be reduced. In addition, when the first to fourth dummy electrodes TD1 to TD4 are disposed between the first and second sub electrodes TA1 and TA2 and the second touch electrode TB, the sensitivity of touch detection may be improved for the first touch operation. Also, the resistance of the bridges, e.g., the first to eighth bridges BR1 to BR8, in the touch cell may be reduced and the bridges may be less visible (or invisible) to a user.

Figure 14:
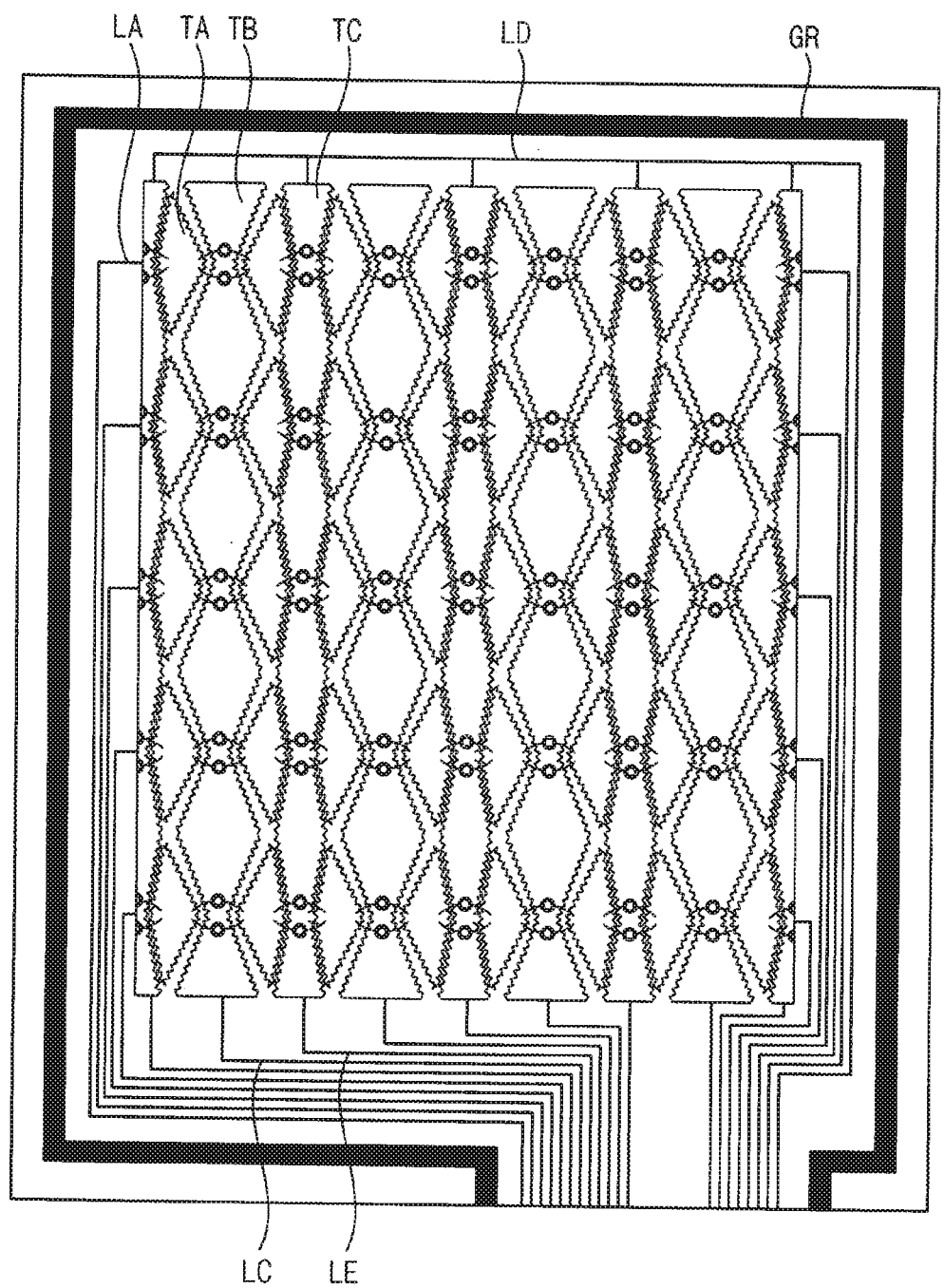
FIG. 14 is a plan view of a touch panel, according to one or more exemplary embodiments.
Figure 15:
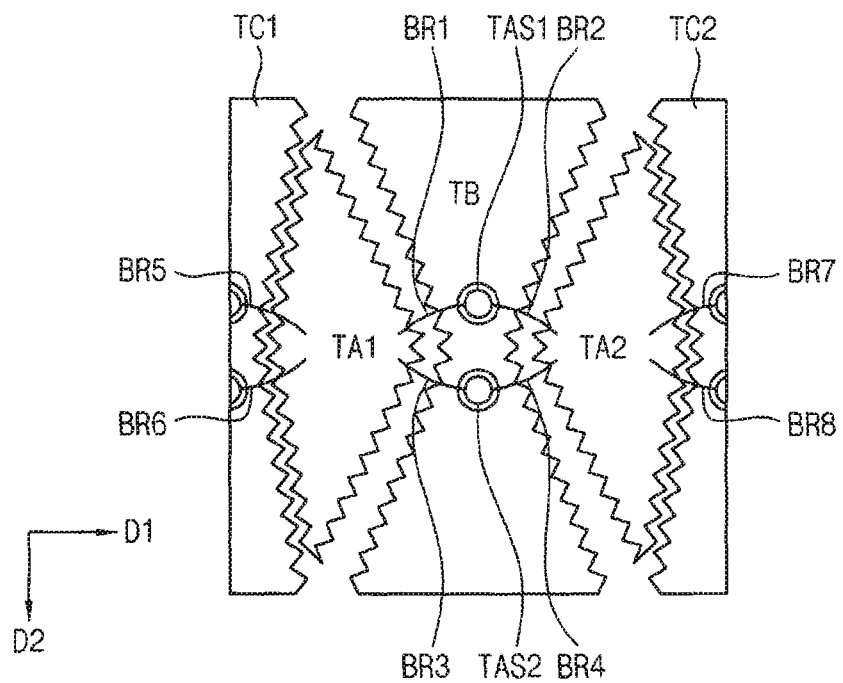
FIG. 15 is a plan view of a touch cell of the touch panel of FIG. 14, according to one or more exemplary embodiments.

FIG. 14 is a plan view of a touch panel, according to one or more exemplary embodiments. FIG. 15 is a plan view of a touch cell of the touch panel of FIG. 14, according to one or more exemplary embodiments.

The touch panel and the display apparatus of FIGS. 14 and 15 are substantially the same as the touch panel and the display apparatus of FIGS. 11 to 12 except for the structure of the touch cell. As such, the same reference numerals will be used to refer to the same or like parts as those described in association with FIGS. 11 to 12, and repetitive explanations have been avoided to prevent obscuring exemplary embodiments described herein.

Referring to FIGS. 14 and 15, the touch cell includes a first touch electrode TA, a second touch electrode TB, and a third touch electrode TC. The first touch electrode TA includes a first sub electrode TA1 and a second sub electrode TA2 spaced apart from the first sub electrode TA1. The second touch electrode TB is disposed between the first sub electrode TA1 and the second sub electrode TA2. Each of the third touch electrodes TC1 and TC2 is disposed between the sub electrodes TA1 and TA2 of neighboring touch cells. The first touch electrode TA may further include first and second connecting electrodes TAS1 and TAS2. It is noted that the first and second connecting electrodes TAS1 and TAS2 may overlap the second touch electrode TB, as seen in FIG. 15.

The touch cell further includes first to fourth bridges BR1 to BR4. The first bridge BR1 electrically connects the first sub electrode TA1 and a first connecting electrode TAS1, and the first bridge BR1 overlaps the second touch electrode TB in a plan view. The second bridge BR2 electrically connects the second sub electrode TA2 and the first connecting electrode TAS1, and the second bridge BR2 overlaps the second touch electrode TB in a plan view. The third bridge BR3 electrically connects the first sub electrode TA1 and a second connecting electrode TAS2, and the third bridge BR3 overlaps the second touch electrode TB in a plan view. The fourth bridge BR4 electrically connects the second sub electrode TA2 and the second connecting electrode TAS2, and the fourth bridge BR4 overlaps the second touch electrode TB in a plan view.

The first sub electrode TA1 may include a first inclined portion facing a first inclined portion of the second touch electrode TB and a second inclined portion facing a second inclined portion of the second touch electrode TB. The first inclined portion and the second inclined portion of the first sub electrode TA1 may have zigzag shapes. In correspondence therewith, the first inclined portion and the second inclined portion of the second touch electrode TB may also have zigzag shapes. Similarly, sides of the first sub electrode TA1 and sides of the third touch electrode TC1 facing each other may have corresponding zigzag shapes. It is noted that the configuration of the second sub electrode TA2, the second touch electrode TB, and the third touch electrode TC2 may be similar to the configuration of the first sub electrode TA1, the second touch electrode TB, and the third touch electrode TC1.

Display cells of a display panel may generally be arranged in a matrix formation. When the touch cells are arranged in a matrix formation or mainly have a rectilinear structure like the display cells, moiré fringe patterns may be visible to the user. According to one or more exemplary embodiments when the sides of the first touch electrode TA, the second touch electrode TB, and the third touch electrode TC have zigzag shapes, a display defect due to the moiré fringe patterns may be prevented (or at least reduced).

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member and the first touch electrode TA and the third touch electrode TC operate in conjunction with the second touch operation (the digitizer operation) associated with the second touch input member. In this manner, the width of an associated display apparatus configured to recognize the first touch and the second touch may be reduced. In addition, the resistance of the bridge in the touch cell may be reduced and the bridge may be less visible (or invisible) to a user. In addition, the sides of the first to third touch electrodes TA, TB, and TC have zigzag shapes so that a display defect due to the moiré fringe patterns may be prevented (or at least reduced).

Figure 16:
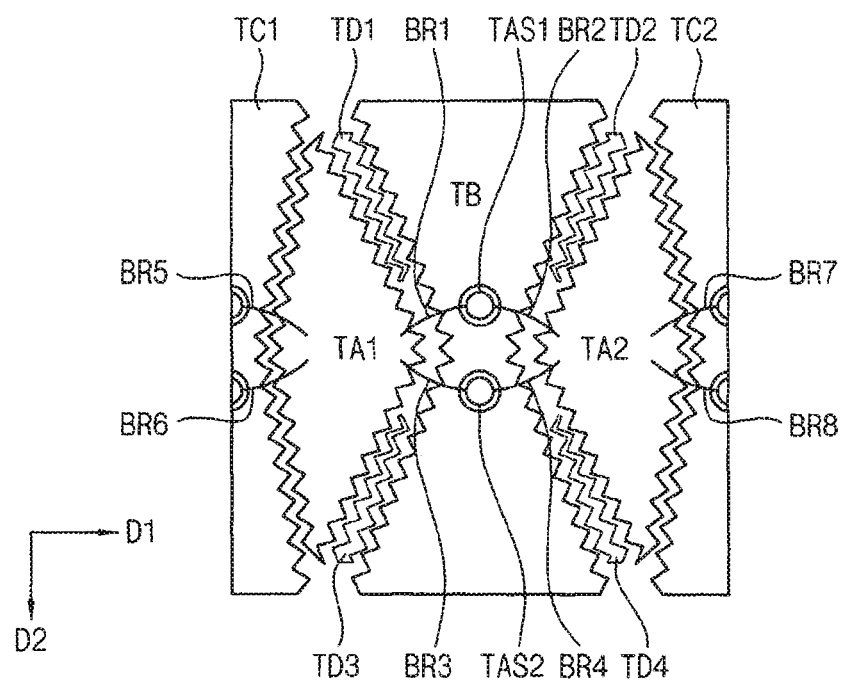
FIG. 16 is a plan view of a touch cell of a touch panel, according to one or more exemplary embodiments.

FIG. 16 is a plan view of a touch cell of a touch panel, according to one or more exemplary embodiments.

The touch panel and the display apparatus of FIG. 16 are substantially the same as the touch panel and the display apparatus of FIGS. 14 and 15 except for the structure of the touch cells. As such, the same reference numerals will be used to refer to the same or like parts as those described in association with FIGS. 14 and 15, and repetitive explanations have been avoided to prevent obscuring exemplary embodiments described herein.

Referring to FIG. 16, the touch cell further includes first to fourth dummy electrodes TD1 to TD4. The first dummy electrode TD1 is disposed between a first inclined portion of the first sub electrode TA1 and a first inclined portion of the second touch electrode TB, the second dummy electrode TD2 is disposed between a first inclined portion of the second sub electrode TA2 and a third inclined portion of the second touch electrode TB, the third dummy electrode TD3 is disposed between a second inclined portion of the first sub electrode TA1 and a second inclined portion of the second touch electrode TB, and the fourth dummy electrode TD4 is disposed between a second inclined portion of the second sub electrode TA2 and a fourth inclined portion of the second touch electrode TB. The first to fourth dummy electrodes TD1 to TD4 may not be connected any electrodes or any lines, and, as such, may be electrically floated. The first to fourth dummy electrodes TD1 to TD4 may have island shapes; however, it is contemplated that any other suitable configuration may be utilized in association with exemplary embodiments described herein. In one or more exemplary embodiments, the first to fourth dummy electrodes TD1 to TD4 may not be disposed in an area where the first to fourth bridges BR1 to BR4 are formed. Further, the first to fourth dummy electrodes TD1 to TD4 may also have zigzag shapes corresponding to the zigzag shapes of the first and second sub electrodes TA1 and TA2 and the second touch electrode TB.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of the display apparatus configured to recognize the first touch and the second touch may be reduced. In addition, when the first to fourth dummy electrodes TD1 to TD4 are disposed between the first and second sub electrodes TA1 and TA2 and the second touch electrode TB, the sensitivity of touch detection may be improved for the first touch operation. Also, the resistance of the bridges, e.g., the first to eighth bridges BR1 to BR8, in the touch cell may be reduced and the bridges may be less visible (or invisible) to a user. In addition, the sides of the first to third touch electrodes TA, TB and TC have zigzag shapes so that a display defect due to moiré fringe patterns may be prevented (or at least reduced).

Figure 17:
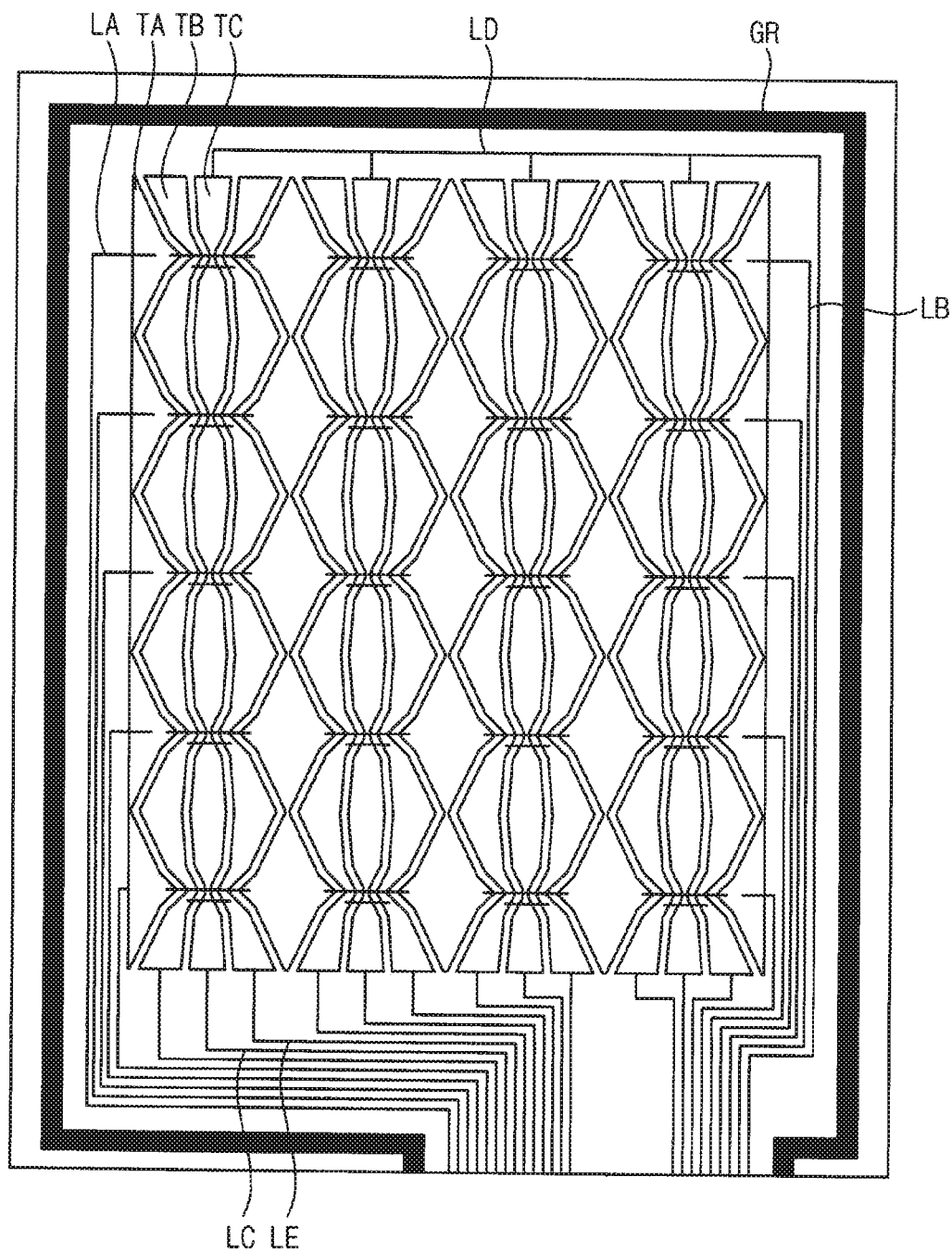
FIG. 17 is a plan view of a touch panel, according to one or more exemplary embodiments.
Figure 17:
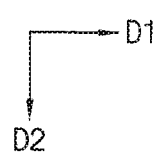
Figure 18:
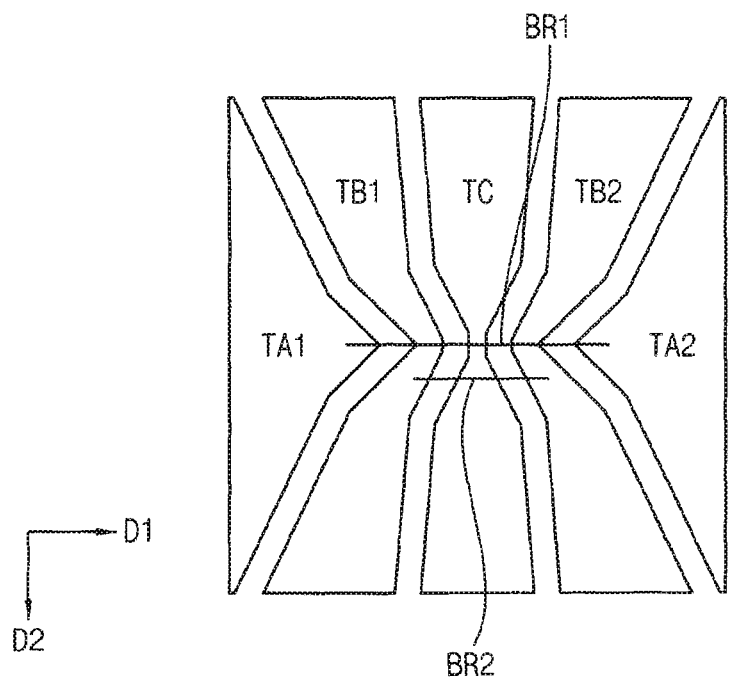
FIG. 18 is a plan view of a touch cell of the touch panel of FIG. 17, according to one or more exemplary embodiments.

FIG. 17 is a plan view of a touch panel, according to one or more exemplary embodiments. FIG. 18 is a plan view of a touch cell of the touch panel of FIG. 17, according to one or more exemplary embodiments.

The touch panel and the display apparatus of FIGS. 17 and 18 are substantially the same as the touch panel and the display apparatus of FIGS. 1 to 4 except for the structure of the touch cells. As such, the same reference numerals will be used to refer to the same or like parts as those described in association with FIGS. 1 to 4, and repetitive explanations have been avoided to prevent obscuring exemplary embodiments described herein.

Referring to FIGS. 17 and 18, the touch cell includes a first touch electrode TA, a second touch electrode TB, and a third touch electrode TC. The first touch electrode TA includes a first sub electrode TA1 and a second sub electrode TA2 spaced apart from the first sub electrode TA1. The second touch electrode TB includes third and fourth sub electrodes TB1 and TB2 disposed between the first sub electrode TA1 and the second sub electrode TA2. The third and fourth sub electrodes TB1 and TB2 are spaced apart from one another with the third touch electrode TC disposed therebetween.

The first sub electrode TA1 and the second sub electrode TA2 are electrically connected to each other via a first bridge BR1. The first bridge BR1 may overlap a portion of the second touch electrode TB and the third touch electrode TC. In addition, the third and fourth sub electrodes TB1 and TB2 are electrically connected to each other via a second bridge BR2. The second bridge BR2 may overlap a portion of the third touch electrode TC.

The third touch electrode TC may have a variable width in the first direction D1 as a function in the second direction D2. For example, the third touch electrode TC may have a relatively greater width in the first direction D1 at upper and lower portions of the touch cell but a relatively shorter width in the first direction D1 at a central portion of the touch cell.

In this manner, the width of the third touch electrode TC may vary from the relatively greater width to the relatively smaller width back to the relatively greater width along a length of the third touch electrode TC.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. Accordingly, the width of the display apparatus that is configured to recognize the first touch and the second touch may be reduced.

Figure 19:
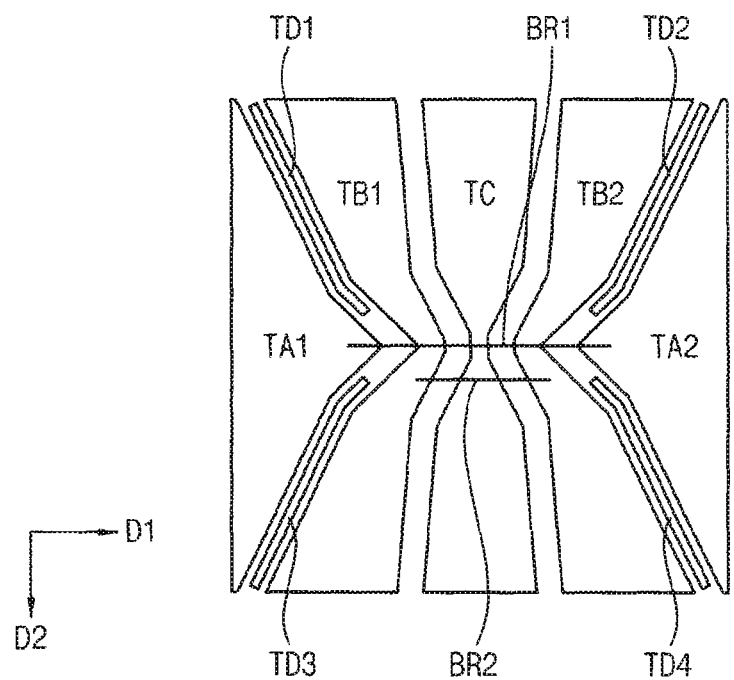
FIG. 19 is a plan view of a touch cell of a touch panel, according to one or more exemplary embodiments.

FIG. 19 is a plan view of a touch cell of a touch panel, according to one or more exemplary embodiments. It is noted that the touch panel and the display apparatus associated with the touch cell of FIG. 19 are substantially similar to the touch panel and the display apparatus FIGS. 17 and 18 except for the structure of the touch cell of FIG. 19. As such, the same reference numerals will be used to refer to the same or like parts as those described in association with FIGS. 17 and 18, and repetitive explanations have been avoided to prevent obscuring exemplary embodiments described herein.

Referring to FIG. 19, the touch cell further includes first to fourth dummy electrodes TD1 to TD4. The first dummy electrode TD1 and the third dummy electrode TD3 are disposed between the first sub electrode TA1 and the third sub electrode TB1. The second dummy electrode TD2 and the fourth dummy electrode TD4 are disposed between the second sub electrode TA2 and the fourth sub electrode TB2.

According to one or more exemplary embodiments, the first to third touch electrodes TA, TB, and TC are integrated in a single touch panel where the first touch electrode TA and the second touch electrode TB operate in conjunction with the first touch operation (the general touch operation) in association with the first touch input member, and the first touch electrode TA and the third touch electrode TC operate in conjunction with the second touch operation (the digitizer operation) in association with the second touch input member. In this manner, a width of the display apparatus configured to detect the first touch and the second touch may be reduced. In addition, the first to fourth dummy electrodes TD1 to TD4 are disposed between the first touch electrode TA and the second touch electrode TB so that the sensitivity of touch detection may be improved for the first touch operation.

Figure 20:
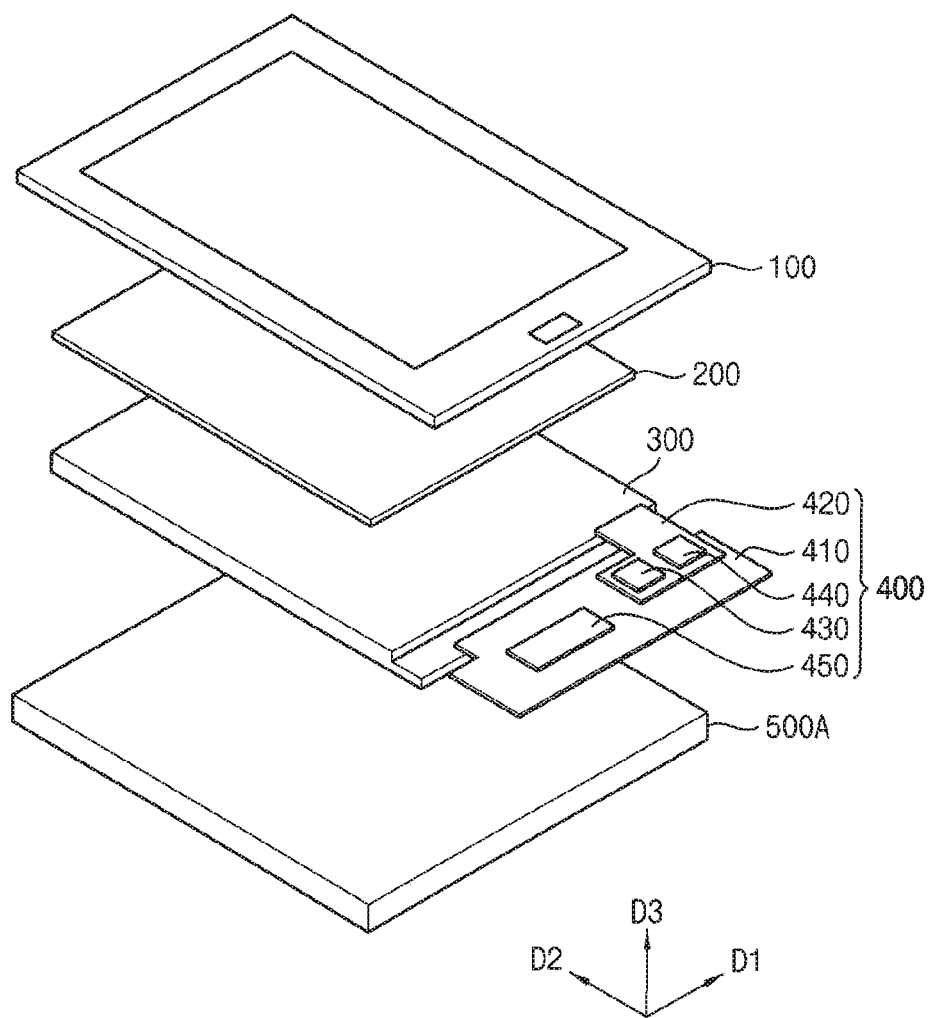
FIG. 20 is an exploded perspective view of a display apparatus, according to one or more exemplary embodiments.

FIG. 20 is an exploded perspective view of a display apparatus, according to one or more exemplary embodiments.

The display apparatus of FIG. 20 is substantially similar to the display apparatus of FIGS. 1 and 2 except for certain components, such as the cushion sheet and heat dissipating member. As such, the same reference numerals will be used to refer to the same or like parts as those described in association with FIGS. 1 and 2, and repetitive explanations have been avoided to prevent obscuring exemplary embodiments described herein.

Referring to FIG. 20, the display apparatus includes a window 100, a polarizing plate 200, a touch display panel 300, a driver 400, and a power coil member 500A. The window 100, the polarizing plate 200, the touch display panel 300, and the driver 400 may be configured and operate similar to the window 100, the polarizing plate 200, the touch display panel 300, and the driver 400 described in association with FIG. 1. Although not illustrated, the power coil member 500A includes a cushion sheet, a power coil, a magnetic shielding material, and a heat dissipating member. The cushion sheet, the power coil, the magnetic shielding material, and the heat dissipating member are integrated to form the power coil member 500A. The power coil member 500A is disposed under the touch display panel 300, and will be described in more detail in association with FIGS. 21A to 21D.

FIGS. 21A, 21B, 21C, and 21D are perspective views of a method of manufacturing an integrated component of a touch panel, according to one or more exemplary embodiments.

Figure 21A:
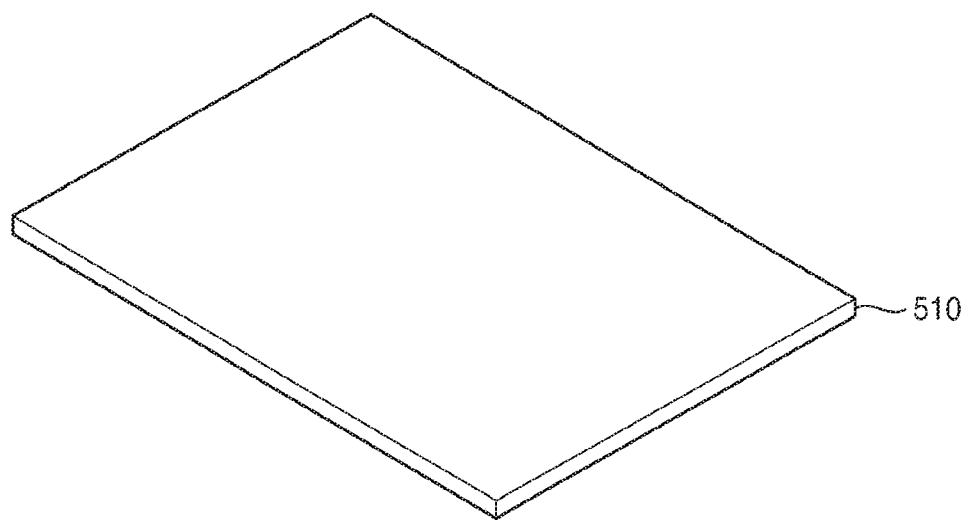
FIGS. 21A, 21B, 21C, and 21D are perspective views of a method of manufacturing an integrated component of a touch panel, according to one or more exemplary embodiments.
Figure 21B:
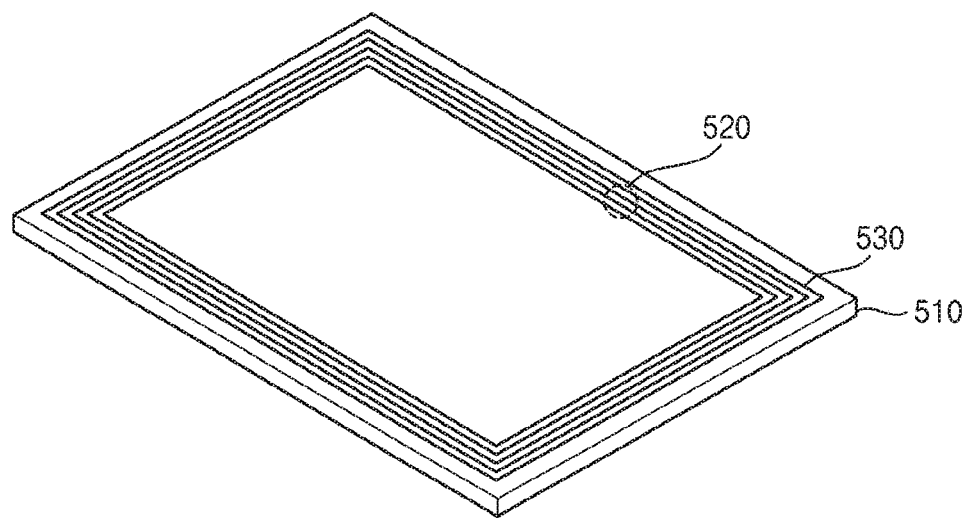

Referring to FIG. 21A, the power coil member 500A includes a cushion sheet 510 protecting the touch display panel 300 from an external force. Referring to FIG. 21B, the power coil 520 may be formed on the cushion sheet 510, and may provide energy to a second touch input member, such as a touch pen having a LC circuit. A loop coil 530 may be formed adjacent to the power coil 520.

Figure 21C:
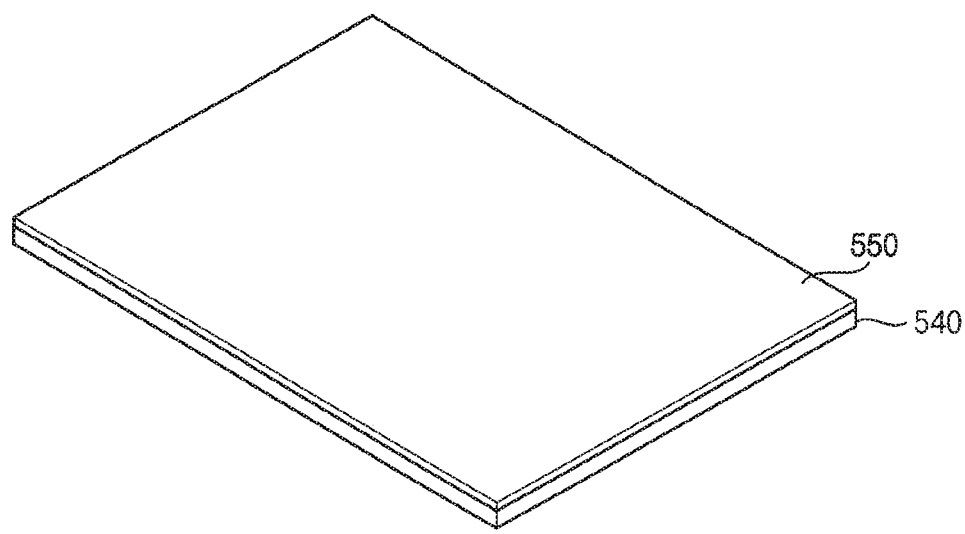
Figure 21D:
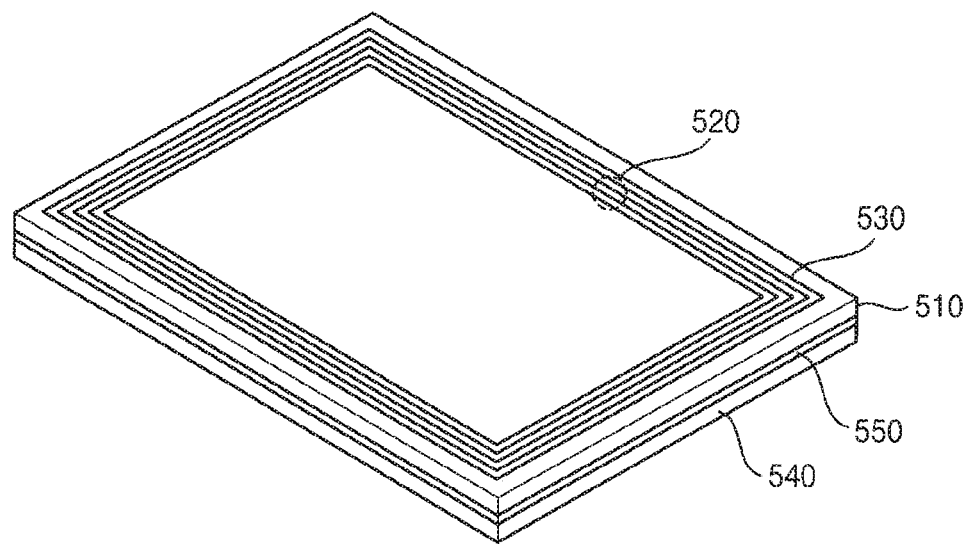

Referring to FIG. 21C, the power coil member 500A further includes a heat dissipating member 540 and a magnetic shielding material 550. The heat dissipating member 540 may be formed under (or attached to) the cushion sheet 510 and may dissipate heat from the display panel. In one or more exemplary embodiments, the heat dissipating member 540 may include graphite. The magnetic shielding material 550 may be formed on the heat dissipating member 540. The magnetic shielding material 550 may be coated on the heat dissipating member 540. By attaching the cushion sheet 510 including the power coil 520 and the loop coil 530 on the magnetic shielding material 550, the cushion sheet 510, the power coil 520, the loop coil 530, the heat dissipating member 540 (as seen in FIG. 21D), and the magnetic shielding material 550 may be integrated as a component of the display apparatus of FIG. 20.

According to one or more exemplary embodiments, the first to third touch electrodes TA, TB, and TC are integrated in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of the display apparatus of FIG. 20 that is capable of recognizing the first touch and the second touch may be reduced. In addition, by using the integrated power coil member 500A, the thickness of the display apparatus of FIG. 20 may be reduced and manufacturing costs of the display apparatus may also be reduced.

Figure 22:
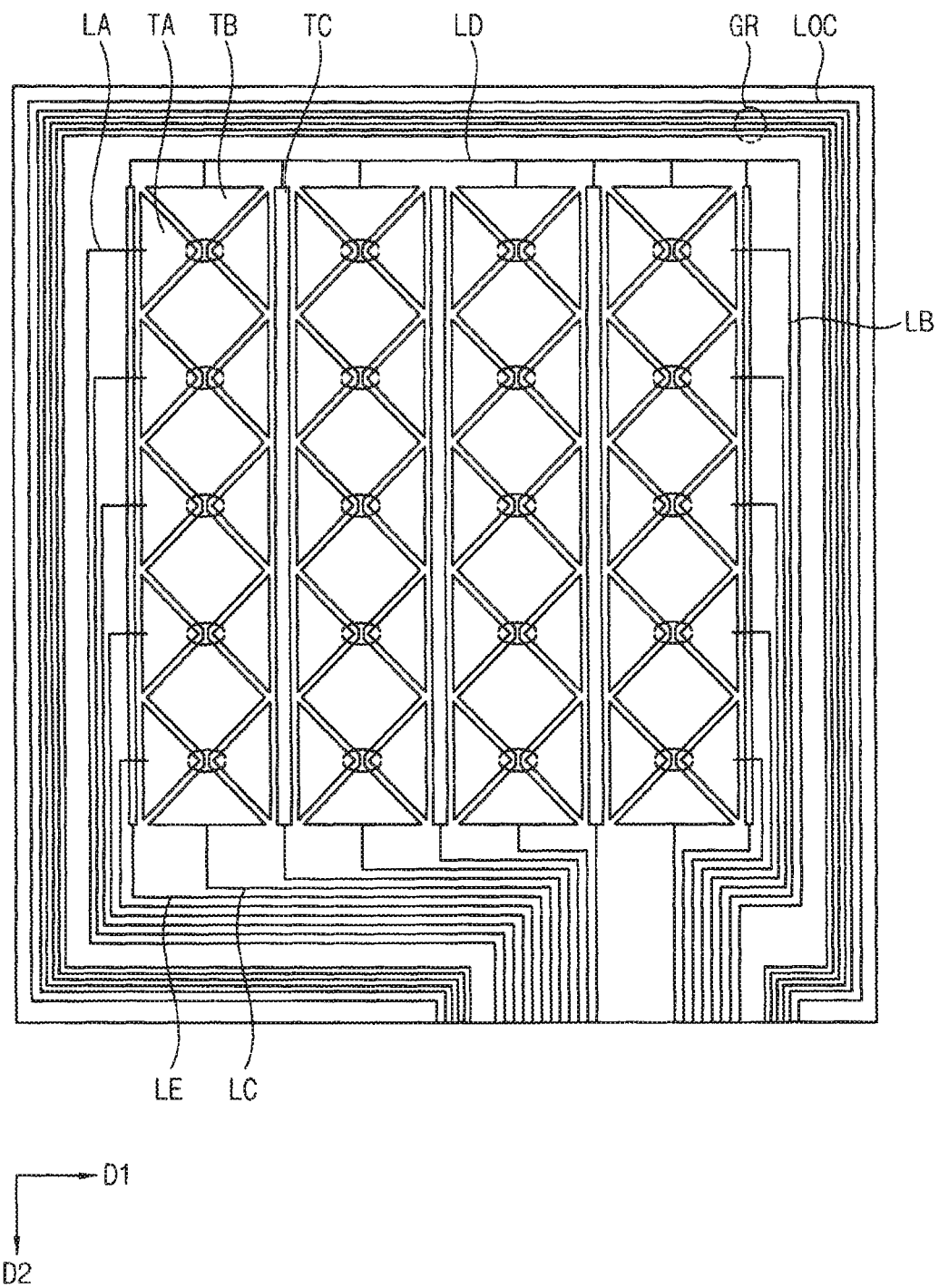
FIG. 22 is a plan view of a touch panel, according to one or more exemplary embodiments.

FIG. 22 is a plan view of a touch panel, according to one or more exemplary embodiments.

The display apparatus of FIG. 22 is substantially similar to the display apparatus of FIGS. 1 and 2 except for the configuration of the touch display panel. As such, the same reference numerals will be used to refer to the same or like parts as those described in association with FIGS. 1 and 2, and repetitive explanations have been avoided to prevent obscuring exemplary embodiments described herein.

Referring to FIG. 22, the touch panel includes first touch electrodes TA, second touch electrodes TB, third touch electrodes TC, first lines LA, second lines LB, third lines LC, a fourth line LD, fifth lines LE, a guard ring GR, and a loop coil LOC. The first touch electrodes TA, the second touch electrodes TB, the third touch electrodes TC, the first lines LA, the second lines LB, the third lines LC, the fourth line LD, and the fifth lines LE may be configured and operate similar to the first touch electrodes TA, the second touch electrodes TB, the third touch electrodes TC, the first lines LA, the second lines LB, the third lines LC, the fourth line LD, and the fifth lines LE described in association with FIG. 3.

The guard ring GR may surround and protect the first touch electrodes TA, the second touch electrodes TB, the third touch electrodes TC, and the lines LA, LB, LC, LD, and LE from static electricity. The guard ring GR includes a plurality of conductive lines. The guard ring GR may form a power coil so that a current flowing through the conductive lines of the guard ring GR may provide energy to the touch input member, e.g., a stylus. The loop coil LOC may be disposed adjacent to the guard ring GR, such that the loop coil LOC is disposed between the guard ring GR and the edge of the touch panel. In this manner, the power coil 610 and the loop coil 620 shown in FIG. 1 may be omitted.

According to one or more exemplary embodiments, the first to third touch electrodes TA, TB, and TC are included in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of the display apparatus configured to recognize the first touch and the second touch may be reduced. In addition, the power coil may be formed on the touch panel so that a conventional power coil sheet may be omitted. As such, a thickness of the display apparatus may be reduced and manufacturing costs of the display apparatus may also be reduced.

Figure 23A:
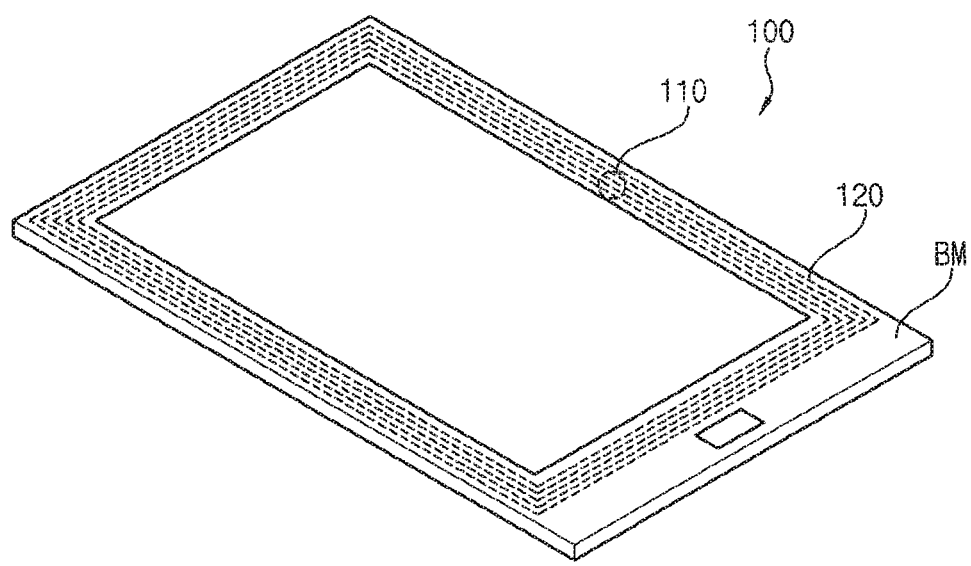
FIG. 23A is a perspective view of a window of a display apparatus, according to one or more exemplary embodiments.
Figure 23B:
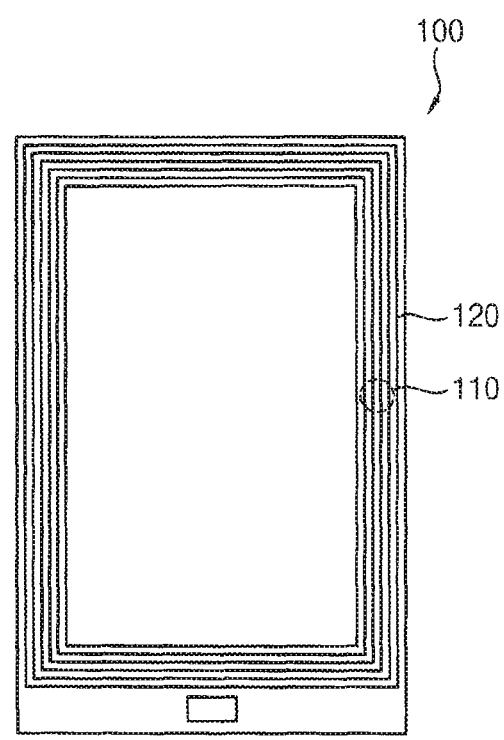
FIG. 23B is a plan view of a rear surface of the window of FIG. 23A, according to one or more exemplary embodiments.

FIG. 23A is a perspective view of a window of a display apparatus, according to one or more exemplary embodiments. FIG. 23B is a plan view of a rear surface of the window of FIG. 23A, according to one or more exemplary embodiments.

Referring to FIGS. 23A and 23B, the window 100 may include a power coil 110 and a loop coil 120. The power coil 110 may be disposed in a light blocking area BM on a rear surface of the window 100. The power coil 110 may provide energy to a second touch input member, such as a touch pen having a LC circuit. The loop coil 120 may also be disposed in the light blocking area BM on the rear surface of the window 100. The loop coil 120 may be disposed adjacent to the power coil 110. The loop coil 120 may be connected to an electrode of the touch panel to recognize the touch of the second touch input member. In this manner, the power coil 610 and the loop coil 620 shown in FIG. 1 may be omitted.

According to one or more exemplary embodiments, the first to third touch electrodes TA, TB, and TC are integrated in a single touch panel where the first touch electrode TA and the second touch electrode TB operate in conjunction with the first touch operation (the general touch operation) associated with the first touch input member, and the first touch electrode TA and the third touch electrode TC operate in conjunction with the second touch operation (the digitizer operation) associated with the second touch input member. In this manner, the width of an associated display apparatus that is capable of recognizing the first touch and the second touch may be reduced. In addition, the power coil may be formed on the rear surface of the window 100 so that a conventional power coil sheet may be omitted. As such, a thickness of the display apparatus may be reduced and manufacturing costs of the display apparatus may also be reduced.

According to one or more exemplary embodiments, first to third touch electrodes for sensing a first touch operation and a second touch operation may be integrated in a single touch panel. In this manner, a thickness of the display apparatus may be reduced.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch panel comprising:
   first touch electrodes comprising sub electrodes spaced apart from one another in a first direction;
   second touch electrodes extending in a second direction crossing the first direction, the second touch electrodes being spaced apart from one another in the first direction; and
   third touch electrodes extending in the second direction and spaced apart from one another in the first direction, the third touch electrodes being shaped differently than the second touch electrodes,
   wherein:
      the first touch electrodes and the second touch electrodes are configured to detect, independent of the third touch electrodes, a first touch of a first touch input member; and
      the first touch electrodes and the third touch electrodes are configured to detect, independent of the second touch electrodes, a second touch of a second touch input member different from the first touch input member.

2. The touch panel of claim 1, wherein:
the first touch input member is a portion of a human body; and
the second touch input member is a touch pen.

3. The touch panel of claim 1, wherein:
the first touch electrodes comprise a first touch electrode that is disposed in association with a first touch cell of the touch panel, the first touch electrode comprises a first sub electrode and a second sub electrode spaced apart from the first sub electrode; and
the second touch electrodes comprise a second touch electrode that is disposed in association with the first touch cell, the second touch electrode is disposed between the first sub electrode and the second sub electrode.

4. The touch panel of claim 3, further comprising:
a first bridge electrically connecting the first sub electrode and the second sub electrode, the first bridge overlapping the second touch electrode.

5. The touch panel of claim 3, wherein:
the first touch electrode further comprises a third sub electrode disposed in association with a second touch cell adjacent to the first touch cell; and
the third touch electrodes comprise a third touch electrode that is disposed between the second sub electrode and the third sub electrode.

6. The touch panel of claim 5, further comprising:
a second bridge electrically connecting the second sub electrode and the third sub electrode, the second bridge overlapping the third touch electrode.

7. The touch panel of claim 3, further comprising:
a fourth touch electrode disposed between the first sub electrode and the second touch electrode.

8. The touch panel of claim 3, wherein:
the first sub electrode comprises:
   a first inclined portion facing a first inclined portion of the second touch electrode; and
   a second inclined portion facing a second inclined portion of the second touch electrode;
the first inclined portion of the first sub electrode comprises a first bent portion; and
the second inclined portion of the first sub electrode comprises a second bent portion.

9. The touch panel of claim 3, wherein:
the first sub electrode comprises:
   a first inclined portion facing a first inclined portion of the second touch electrode; and
   a second inclined portion facing a second inclined portion of the second touch electrode; and
a contact portion of the first inclined portion of the first sub electrode and the second inclined portion of the first sub electrode comprises a concave portion.

10. The touch panel of claim 3, further comprising:
a connecting electrode overlapping with the second touch electrode;
a first bridge electrically connecting the first sub electrode and the connecting electrode, the first bridge overlapping with the second touch electrode; and
a second bridge electrically connecting the second sub electrode and the connecting electrode, the second bridge overlapping with the second touch electrode.

11. The touch panel of claim 3, wherein:
the first sub electrode comprises:
   a first inclined portion facing a first inclined portion of the second touch electrode; and
   a second inclined portion facing a second inclined portion of the second touch electrode;
the first inclined portion of the first sub electrode comprises zigzag shapes; and
the second inclined portion of the first sub electrode comprises zigzag shapes.

12. The touch panel of claim 11, further comprising:
a fourth touch electrode between the first inclined portion of the first sub electrode and the first inclined portion of the second touch electrode,
wherein the fourth touch electrode comprises zigzag shapes.

13. The touch panel of claim 1, wherein:
the first touch electrodes comprise a first touch electrode that is disposed in association with a first touch cell of the touch panel, the first touch electrode comprising a first sub electrode and a second sub electrode spaced apart from the first sub electrode;
the second touch electrodes comprise a second touch electrode that is disposed in association with the first touch cell, the second touch electrode comprising a third sub electrode and a fourth sub electrode spaced apart from the third sub electrode, the third sub electrode and the fourth sub electrode being disposed between the first sub electrode and the second sub electrode; and
the third touch electrodes comprise a third touch electrode that is disposed in association with the first touch cell and is disposed between the third sub electrode and the fourth sub electrode.

14. The touch panel of claim 13, further comprising:
a first bridge electrically connecting the first sub electrode and the second sub electrode; and
a second bridge electrically connecting the third sub electrode and the fourth sub electrode.

15. The touch panel of claim 1, wherein at least one of the third touch electrodes comprises a variable width in the first direction.

16. The touch panel of claim 1, wherein first end portions of the third touch electrodes are commonly connected to a same conductive line.

17. The touch panel of claim 1, further comprising:
first conductive lines connected to the first touch electrodes, the second touch electrodes, and the third touch electrodes; and
a guard ring surrounding the first conductive lines to protect the first touch electrodes, the second touch electrodes, the third touch electrodes, and the first conductive lines from static electricity.

18. The touch panel of claim 17, wherein:
the guard ring comprises second conductive lines; and
the second conductive lines are configured to provide energy to a touch input member.

19. The touch panel of claim 18, further comprising:
a loop coil adjacent to the second conductive lines,
wherein the loop coil surrounds the first touch electrodes, the second touch electrodes, the third touch electrodes, and the first conductive lines.

20. A display apparatus comprising:
a display panel comprising:
a circuit substrate,
an organic light emitting element disposed on the circuit substrate; and
an encapsulating glass covering the organic light emitting element; and
a touch panel disposed on the display panel, the touch panel comprising:
first touch electrodes comprising sub electrodes spaced apart from one another in a first direction;
second touch electrodes extending in a second direction crossing the first direction, the second touch electrodes being spaced apart from one another in the first direction; and
third touch electrodes extending in the second direction and spaced apart from one another in the first direction, the third touch electrodes being shaped differently than the second touch electrodes,
wherein:
the first touch electrodes and the second touch electrodes are configured to detect, independent of the third touch electrodes, a first touch of a first touch input member; and
the first touch electrodes and the third touch electrodes are configured to detect, independent of the second touch electrodes, a second touch of a second touch input member different from the first touch input member.

21. The display apparatus of claim 20, further comprising:
a magnetic shielding sheet configured to shield the touch panel from a magnetic force, the display panel being disposed on the magnetic shielding sheet; and
conductive lines disposed on the magnetic shielding sheet, the conductive lines being configured to provide energy to a touch input member.

22. The display apparatus of claim 20, further comprising:
a cushion sheet configured to protect the touch panel from an applied force, the display panel being disposed on the cushion sheet; and
a power coil disposed on the cushion sheet, the power coil being configured to provide energy to a touch input member.

23. The display apparatus of claim 22, further comprising:
a heat dissipating member configured to dissipate heat from the display panel, the touch panel being disposed on the heat dissipating member; and
a magnetic shielding material disposed on the heat dissipating member; and
wherein the cushion sheet, the power coil, the magnetic shielding material, and the heat dissipating member are integrated together to form a component of the display apparatus.

24. The display apparatus of claim 20, wherein the touch panel further comprises:
first conductive lines connected to the first touch electrodes, the second touch electrodes, and the third touch electrodes; and
a guard ring surrounding the first conductive lines to protect the first touch electrodes, the second touch electrodes, the third touch electrodes, and the first conductive lines from static electricity.

25. The display apparatus of claim 24, wherein:
the guard ring comprises second conductive lines; and
the second conductive lines are configured to provide energy to a touch input member.

26. The display apparatus of claim 25, wherein the touch panel further comprises:
a loop coil disposed adjacent to the second conductive lines,
wherein the loop coil surrounds the first touch electrodes, the second touch electrodes, the third touch electrodes, and the first conductive lines.

27. The display apparatus of claim 20, further comprising:
a window disposed on the touch panel to cover the touch panel; and
a power coil disposed in a light blocking area on a rear surface of the window, the power coil being configured to provide energy to a touch input member.

28. The display apparatus of claim 20, further comprising:
a first touch driving chip configured to sense, in a first touch mode, coordinates of the first touch based on output from the first touch electrodes and the second touch electrodes; and
a second touch driving chip configured to sense, in a second touch mode different from the first touch mode, coordinates of the second touch based on output from the first touch electrodes and the third touch electrodes.

29. The touch panel of claim 1, wherein:
the first touch electrodes and the second touch electrodes are configured to output, in a first touch mode, signals to detect coordinates of the first touch; and
the second touch electrodes and the third touch electrodes are configured to output, in a second touch mode different from the first touch mode, signals to detect coordinates of the second touch.

30. The touch panel of claim 1, wherein the first touch electrodes, the second touch electrodes, and the third touch electrodes comprise substantially the same material as one another.

31. The display apparatus of claim 20, wherein the first touch electrodes, the second touch electrodes, and the third touch electrodes comprise substantially the same material as one another.

* * * * *